United States Patent
Piret et al.

(10) Patent No.: US 6,560,362 B1
(45) Date of Patent: May 6, 2003

(54) ENCODING AND INTERLEAVING DEVICE AND METHOD FOR SERIAL OR HYBRID TURBOCODES

(75) Inventors: Philippe Piret, Cesson-Sevigne (FR); Claude Le Dantec, Saint Hilaire des Landes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/435,852

(22) Filed: Nov. 8, 1999

(30) Foreign Application Priority Data

Nov. 9, 1998 (FR) .............................. 98 14083

(51) Int. Cl.[7] .................. G06K 9/36; G06F 11/00; H03M 13/00
(52) U.S. Cl. .................. 382/232; 714/701; 714/781
(58) Field of Search .................. 352/232, 233, 352/247; 714/701, 775, 756, 702; 341/81, 82, 67, 51; 375/285, 296, 346, 362

(56) References Cited

U.S. PATENT DOCUMENTS

| | | | | | |
|---|---|---|---|---|---|
| 3,571,794 | A | * | 3/1971 | Tong | 375/365 |
| 4,394,642 | A | * | 7/1983 | Currie et al. | 341/81 |
| 4,547,887 | A | * | 10/1985 | Mui | 375/285 |
| 4,566,105 | A | * | 1/1986 | Oisel et al. | 714/756 |
| 5,936,559 | A | * | 8/1999 | Howard | 341/107 |
| 6,084,918 | A | * | 7/2000 | Piret | 332/103 |
| 6,226,259 | B1 | * | 5/2001 | Piret | 370/208 |
| 6,370,670 | B1 | * | 4/2002 | Le Dantec et al. | 714/701 |

FOREIGN PATENT DOCUMENTS

| | | |
|---|---|---|
| EP | 0 928 071 | 7/1999 |
| WO | 96/24098 | 8/1996 |
| WO | 97/38495 | 10/1997 |
| WO | 98/11671 | 3/1998 |

OTHER PUBLICATIONS

Benedetto et al., "Serial Concatenation of Interleaved Codes: Performance Analysis, Design, and Iterative Decoding", IEEE Transactions on Information Theory, vol.44, No.3, May 1998, pp.: 909–926.*

Benedetto et al., "Analysis, Design, and Iterative Decoding of Double Serially Concatenated Codes with Interleaver", IEEE Journal on Selected Areas in Communications, vol. 16, No.2, Feb. 1998, pp.: 231–244.*

Danny T. Chi, "A New Algorithm for Correcting Single Burst Errors with Reed–Solomon Codes", IEEE, 1991, pp.: 1254–1258.*

Lo et al., "High Dimensional Circular Trellis–Coded Modulation", IEEE, 1998, pp.:560–564.*

"Near Optimum Error Correcting Coding and Decoding: Turbo–Codes", Berrou C, et al., IEEE Transactions on Communications, vol. 33, No. 10, pp 1261–1271, XP000629465, ISSN 0090–6778, Oct. 1, 1996.

"Serial Concatenation of Interleaved Codes: Analytical Performance Bounds", S. Benedetto, et al., Communications: The Key to Global Prosperity, Globecom 1996, London, Nov. 18–22, 1996, vol. 1, Nov. 18, 1996, pp. 106–110, XP000742135, Institute of Electrical and Electronics EngineerSIBSN: 0–7803–337–3.

* cited by examiner

*Primary Examiner*—Andrew W. Johns
*Assistant Examiner*—Duy M. Dang
(74) *Attorney, Agent, or Firm*—Fitzpatrick, Cella, Harper & Scinto

(57) ABSTRACT

The encoding method to which the present invention relates takes into account a serial turbo-encoding having at least one permutation operation which retains the divisibility of polynomial representations of sequences by predetermined polynomials and a convolutional encoding operation which includes a division by such a predetermined polynomial.

35 Claims, 9 Drawing Sheets

ENCODING AND INTERLEAVING DEVICE AND METHOD FOR SERIAL OR HYBRID TURBOCODES

Figure 1:
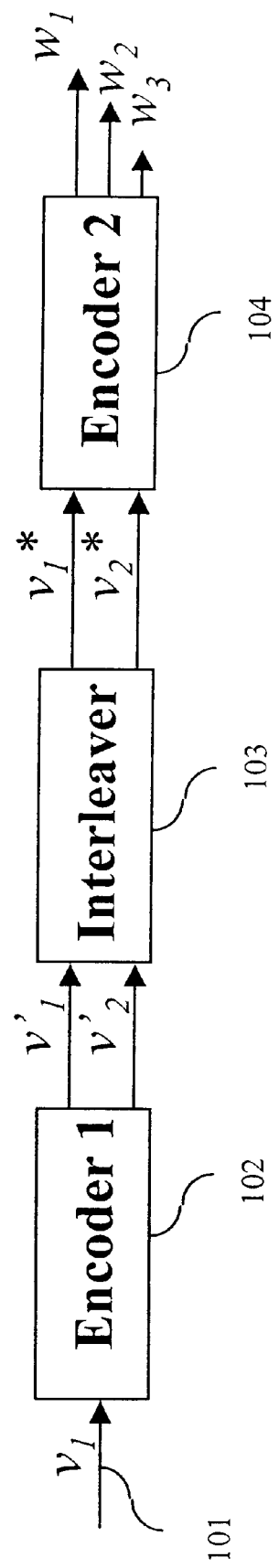

The present invention concerns an interleaver, an encoding device, a permutation method, a encoding method, a decoding device and method and systems using them.

It applies equally well to the encoding of data representing a physical quantity, to the encoding of data in the form of codes capable of modulating a physical quantity, to the decoding of data modulated signals, and to the decoding of data representing physical quantities. These data can, for example, represent images, sounds, computer data, electrical quantities, or stored data.

The invention finds an application in the field of serial or hybrid convolutional codes. When the latter are used for implementing an iterative decoding, these codes are greatly improved when their encoders contain a permutation device. In this case, they are usually referred to as "turbocodes" and the corresponding iterative decoder is referred to as a "turbodecoder".

Serial turbocodes relate to the serial concatenation of two convolutional encoders separated by an interleaver. The decoding method is iterative. Hybrid turbocodes have an architecture which is both serial and parallel.

The second encoder of a serial turbo-encoder is always systematic and recursive.

On these subjects, documents which serve as references are:
- the articles by Messrs. C. BERROU, A. GLAVIEUX and P. THITIMAJSHIMA entitled "Near Shannon limit error-correcting coding and decoding:turbocodes" published with the reports of the "ICC'93" conference, 1993, pages 1064 to 1070, and by Messrs. C. BERROU and A. GLAVIEUX entitled "Near Optimum error-correcting coding and decoding: turbo-codes" published by IEEE Transactions on Communication, Volume COM-44, pages 1261 to 1271, in October 1996, with regard to parallel turbo-encoding,
- the articles "Serial concatenation of interleaved codes: Performance analysis, design and iterative decoding", Benedetto, Montorsi, (Univ. Politecnico di Torino, Italy), Divsalar, Pollara, (JPL, USA), TDA progress report, 42-126, August 1996; and "Hybrid concatenated codes and iterative decoding", Divsalar, Pollara, (JPL, USA), TDA progress report, 42-130, August 1997, with regard to serial or hybrid turbo-encoding.

However, the formation of the permutation devices is far from being completely mastered. For example, this device uses square or rectangular matrices which are written into one row after another and read from one column after another. These matrices are generally very large, for example 256×256 in size.

Let, for example, the permutation device with k=65536=256×256, mentioned above, be considered, and let a predetermined error probability equal to $10^{-5}$ be chosen for simulating the performance of a turbocode using this device. Consequently, the mean number of errors over the binary values per 256×256 block will be close to 1, but it will not be known whether each item of binary information has the same error probability. This error probability could be quite high for binary values having an "unfortunate" position in the permutation device and this probability could be much lower for more "fortunate" positions.

One possible way for remedying this situation is to carry out a harmonious and joint design of the permutation device and the convolutional encoders in order to guarantee a reasonable uniformity of the error rate over the binary values after decoding, according to the position of the binary information in the permutation device.

Another problem concerns the lack of algebraic tools for specifying the permutation devices. It would be useful to have available means making it possible to specify a selection of permutation devices having performances representative of the set of all the permutation devices.

In the remainder of the description, for representing a sequence $\underline{u}$, the form $\underline{u}=(u_0, u_1, \ldots, u_{k-1})$, and the associated polynomial form:

$$u(x)=u_0 x^0 + u_1 x^1 + \ldots + u_{k-1} x^{k-1},$$

are used indiscriminately,
and a sequence formed by permutation of the binary data of the sequence $\underline{u}$ will be denoted by $\underline{u}^*$.

The polynomial divisions used are of the type of division according to ascending powers, well known to persons skilled in the art. They use modulo 2 arithmetic.

The simultaneous return to the zero state of the convolutional encoders used in a turbo-encoder is a classic problem.

The present invention intends to propose families of interleavers which guarantee the return to zero of the convolutional encoders used as components in a serial or hybrid turbo-encoder.

To that end, according to a first of its aspects, the present invention relates to an encoding method, characterised in that:

1/ it takes into account:
   two predetermined integers M1 and M2, equal to or greater than 1,
   a number K, greater than or equal to 1, of sequences $a_i$ (i=1, . . . , K) of binary data representing a physical quantity, each sequence $a_i$ having:
      a polynomial representation $a_i(x)$ which is a multiple of a predetermined polynomial $g_i(x)$, and
      a number of binary data items equal to the product of any integer number M and the integer N0, the smallest integer such that the polynomial $x^{N0}+1$ is divisible by each of the polynomials $g_i(x)$;

2/ it has an operation of convolutional encoding of the sequences $a_i$ into K+M2 so-called "intermediate" sequences $d_i$, 3/ it has a first production operation for a number (K+M2)*M1 of so-called "permuted" sequences, $d_{ij}^*$, (i=1, . . . , K+M2; j=1, . . . , M1), each sequence $d_{ij}^*$ being obtained by a permutation of the corresponding sequence $d_i$, the said permutation being, in a representation where the binary data items of each sequence $d_i$ are written, row by row, Into a table with N0 columns and M rows, the result of any number of so-called elementary permutations, each of which:
   either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $d_i$,
   or is any permutation of the symbols of a column of the said table; and
   having, in consequence, a polynomial representation $d_{ij}^*(x)$ which is equal to a polynomial product $c_{ij}(x)g_{ij}(x)$, 4/ it has a second production operation for M1 redundant sequences, the polynomial representation of which is equal to $\Sigma f_{ij}(x)c_{ij}(x)$, for i=1, . . . , K+M2 and j=1, . . . ,M1, each polynomial $f_{ij}(x)$ being a polynomial of degree at most equal to the degree of the polynomial $g_{ij}(x)$ with the same indices i and j.

Above, there have been introduced, in a representation where the binary data items of the sequence a are arranged in a table of N0 columns and M rows, the successions of permutations taken from the set of permutations having, on the one hand, the automorphisms of the binary cyclic code of length N0 and with generator polynomial g(x), permuting between them the columns of the table and, on the other hand, the permutations working solely on data of one and the same column and permuting between them at least two of the said data items.

The inventors have, discovered that all these successions of permutations, and only these, guarantee that, for any polynomial a(x) whose division by g(x) leaves a null remainder, the permuted polynomial a*(x) has the same property.

For a study of the conditions governing the choice of the $g_{ij}$'s, the reader can refer to page 234 of the book by Mrs F. J. MAC WILLIAMS and Mr N. J. A. SLOANE *"The theory or error-correcting codes"* published by the publisher North-Holland in 1977, the seventh impression of which took place in 1992).

All the choices described in the present invention include the interleavers described in the two articles mentioned above. Thus the performances expressed in terms of error rate as a function of the signal/noise ratio can be improved without increasing the complexity of the turbo-encoder nor that of the turbodecoder.

According to a second aspect, the present invention relates to an encoding method, characterised in that:

1/ it takes into account:
   two predetermined integers M1 and M2, equal to or greater than 1,
   a number K, greater than or equal to 1, of sequences $a_i$ (i=1, . . . ,K) of binary data representing a physical quantity, each sequence $a_i$ having:
      a polynomial representation $a_i(x)$ which is a multiple of a predetermined polynomial $g_i(x)$ with no multiple polynomial factors, and
      a number of binary data items equal to the product of any odd integer number M and the integer N0, the smallest integer such that the polynomial $x^{N0}+1$ is divisible by each of the polynomials $g_i(x)$;

2/ it has an operation of convolutional encoding of the sequences $a_i$ into K+M2 so-called "intermediate" sequences $d_i$, 3/ it has a first production operation for a number (K+M2) *M1 of so-called "permuted" sequences, $d_{ij}*$, (i=1, . . . ,K; j=1, . . . ,M1), each sequence $d_{ij}*$ having a polynomial representation equal to $d_{ij}*(x)=d_i(x^{e_{ij}})$ modulo $(x^n+1)$, where
   n is the product of the number M and the integer N0,
   $e_{ij}$ is a number relatively prime with n
   $c_{ij}$ is the quotient of $d_{ij}*(x)$ divided by $g_{ij}(x)$,
   the polynomial $g_{ij}(x)$ is the generator polynomial of the smallest cyclic code of length N0 containing the polynomial $g_i(x^{e_{ij}})$ modulo $(x^{N0}+1)$,
   at least one permuted sequence $a_{ij}*$ being different from the corresponding sequence $a_i*$, 4/ it has a second production operation for M1 redundant sequences, the polynomial representation of which is equal to $\Sigma f_{ij}(x)c_{ij}(x)$, for i=1, . . . ,K+M2 and j=1, . . . ,M1, each polynomial $f_{ij}(x)$ being a predetermined polynomial of degree at most equal to the degree of the polynomial $g_{ij}(x)$ with the same indices i and j.

By virtue of these provisions, the majority of columns in the table can be moved by permutation, on the one hand, and, within this restricted choice, the minimum distance of the turbocode is more easily analysable and therefore can be optimized, on the other hand.

This second aspect of the invention has the same advantages as the first aspect.

According to particular characteristics, during the first production operation, all the values of the exponents $e_{ij}$ having the same value of the index j are identical.

By virtue of these provisions, the encoding method to which the present invention relates makes it possible to perform all the interleavings with j fixed in the same manner. It is therefore simple to carry out.

By virtue of these provisions, the polynomials $g_{ij}$ are all identical.

According to particular characteristics, during the first production operation, all the values of the exponents $e_{ij}$ are equal to a power of 2.

According to particular characteristics, the encoding method to which the present invention relates, as briefly described above, has an operation of transmitting, on the one hand, the sequences $a_i$, and, on the other hand, a subset of the data of the other sequences.

By virtue of these provisions, the efficiency of the method is increased.

According to other particular characteristics, the encoding method to which the present invention relates has an addition operation during which additional so-called "padding" information items are added to sequences $u_i$ of information data items in order to form the sequences $a_i$ guaranteeing the divisibility of the polynomial representation of the resulting sequence $a_i$ by the polynomial $g_i(x)$.

Thus, the divisibility of each sequence $a_i$ by the sequence $g_i$ is guaranteed by a pre-encoding operation.

According to other particular characteristics, during the operation of convolutional encoding of the sequences $a_i$ into K+M2 so-called "intermediate" sequences $d_i$, an operation of multiplying the polynomial representation of each sequence $a_i$ by the polynomial $g_i(x)$ is performed.

Thus, it is the convolutional encoding operation which guarantees that the polynomial representations of the sequences to be interleaved corresponding to the sequences $a_i$ are respectively multiples of the polynomials $g_i(x)$.

According to particular characteristics, the encoding method to which the present invention relates, as briefly described above, also has:

5/ a third production operation for a number K*M3 of so-called "permuted" sequences, $a'_{ij}*$, (i=1, . . . ,K; j=1, . . . ,M3), each sequence $a'_{ij}*$
   being obtained by a permutation of the corresponding sequence $a_i$, the said permutation being, in a representation where the binary data items of each sequence $a_i$ are written, row by row, into a table with N0 columns and M rows, the result of any number of so-called elementary permutations, each of which:
      either has the property of transforming the cyclic code of length N0 and with generator polynomial $g'_i(x)$ into an equivalent cyclic code with generator polynomial $g'_{ij}(x)$ which may be equal to $g'_i(x)$, and acts by permutation on the N0 columns of the table representing $a_i$,
      or is any permutation of the symbols of a column of the said table; and
   having, in consequence, a polynomial representation $a'_{ij}*(x)$ which is equal to a polynomial product $b'_{ij}(x)g'_{ij}(x)$, 6/ a fourth production operation for M3 redundant sequences, the polynomial representation of which is equal to $\Sigma f'_{ij}(x) b'_{ij}(x)$, for j=1,...,M3, each polynomial $f'_{ij}(x)$ being a polynomial of degree at most equal to the degree of the polynomial $g'_{ij}(x)$ with the same indices i and j.

According to particular characteristics, the encoding method to which the present invention relates, as briefly described above:

5/ has a third production operation for a number K*M3 of so-called "permuted" sequences, $a'_{ij}{}^*$, (i=1, ..., K; j=1,...,M3), each sequence $a'_{ij}{}^*$ having a polynomial representation equal to $a'_{ij}{}^*(x) = a_i(x^{e'ij})$ modulo $(x^n+1)$, where
n is the product of the number M and the integer N0,
$e'_{ij}$ is a number relatively prime with n
$b'_{ij}$ is the quotient of $a'_{ij}{}^*(x)$ divided by $g'_{ij}(x)$,
the polynomial $g'_{ij}(x)$ is the generator polynomial of the smallest cyclic code of length N0 containing the polynomial $g'_i(x^{e'ij})$ modulo $(x^{N0}+1)$, 6/ it has a fourth production operation for M3 redundant sequences, the polynomial representation of which is equal to $\Sigma f'_{ij}(x) b'_{ij}(x)$, for j=1,...,M3, each polynomial $f'_{ij}(x)$ being a predetermined polynomial of degree at most equal to the degree of the polynomial $g'_{ij}(x)$ with the same indices i and j.

By virtue of each of these provisions, the hybrid turbo-encoders enjoy the advantages of the present invention, as described above.

According to a third aspect, the present invention relates to an encoding device, characterised in that it has a processing means adapted to:

1/ take into account:
two predetermined integers M1 and M2, equal to or greater than 1,
a number K, greater than or equal to 1, of sequences $a_i$ (i=1, ..., K) of binary data representing a physical quantity, each sequence $a_i$ having:
a polynomial representation $a_i(x)$ which is a multiple of a predetermined polynomial $g_i(x)$, and
a number of binary data items equal to the product of any integer number M and the integer N0, the smallest integer such that the polynomial $x^{N0}+1$ is divisible by each of the polynomials $g_i(x)$;

2/ perform a convolutional encoding of the sequences $a_i$ into K+M2 so-called "intermediate" sequences $d_i$, 3/ perform a first production operation for a number (K+M2)*M1 of so-called "permuted" sequences, $d_{ij}{}^*$, (i=1, ..., K+M2; j=1, ..., M1), each sequence $d_{ij}{}^*$ being obtained by a permutation of the corresponding sequence $d_i$, the said permutation being, in a representation where the binary data items of each sequence $d_i$ are written, row by row, into a table with N0 columns and M rows, the result of any number of so-called elementary permutations, each of which:
either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $d_i$,
or is any permutation of the symbols of a column of the said table; and
having, in consequence, a polynomial representation $d_{ij}{}^*(x)$ which is equal to a polynomial product $c_{ij}(x) g_{ij}(x)$,
at least one permuted sequence $a_{ij}{}^*$ being different from the corresponding sequence $a_i{}^*$, 4/ perform a second production operation for M1 redundant sequences, the polynomial representation of which is equal to $\Sigma f_{ij}(x) c_{ij}(x)$, for i=1, ..., K+M2 and j=1,...,M1, each polynomial $f_{ij}(x)$ being a polynomial of degree at most equal to the degree of the polynomial $g_{ij}(x)$ with the same indices i and j.

According to a fourth aspect, the present invention relates to an encoding device, characterised in that it has a processing means adapted to:

1/take into account:
two predetermined integers M1 and M2, equal to or greater than 1,
a number K, greater than or equal to 1, of sequences $a_i$ (i=1, ..., K) of binary data representing a physical quantity, each sequence $a_i$ having:
a polynomial representation $a_i(x)$ which is a multiple of a predetermined polynomial $g_i(x)$ with no multiple polynomial factors, and
a number of binary data items equal to the product of any odd integer number M and the integer N0, the smallest integer such that the polynomial $x^{N0}+1$ is divisible by each of the polynomials $g_i(x)$;

2/ perform an operation of convolutional encoding of the sequences $a_i$ into K+M2 so-called "intermediate" sequences $d_i$, 3/ perform a first production operation for a number (K+M2)*M1 of so-called "permuted" sequences, $d_{ij}{}^*$, (i=1, ..., K; j=1, ..., M1), each sequence $d_{ij}{}^*$ having a polynomial representation equal to $d_{ij}{}^*(x) = d_i(x^{eij})$ modulo $(x^n+1)$, where
n is the product of the number M and the integer N0,
$e_{ij}$ is a number relatively prime with n
$c_{ij}$ is the quotient of $d_{ij}{}^*(x)$ divided by $g_{ij}(x)$,
the polynomial $g_{ij}(x)$ is the generator polynomial of the smallest cyclic code of length N0 containing the polynomial $g_i(x^{eij})$ modulo $(x^{N0}+1)$,
at least one permuted sequence $a_{ij}{}^*$ being different from the corresponding sequence $a_i{}^*$, 4/ perform a second production operation for M1 redundant sequences, the polynomial representation of which is equal to $\Sigma f_{ij}(x) c_{ij}(x)$, for i=1, ..., K+M2 and j=1, ..., M1, each polynomial $f_{ij}(x)$ being a predetermined polynomial of degree at most equal to the degree of the polynomial $g_{ij}(x)$ with the same indices i and j.

According to a fifth aspect, the present invention relates to a decoding method, characterised in that:

1/ it takes into account:
predetermined integers M1 and M2 equal to or greater than 1,
a number K, greater than or equal to 1, of sequences $a_i$ (i=1,...,K) of data representing a physical quantity, each sequence $a_i$ having:
a polynomial representation $a_i(x)$ which is a multiple of a predetermined polynomial $g_i(x)$, and
a number of binary data items equal to the product of any integer number M and the integer N0, the smallest integer such that the polynomial $x^{N0}+1$ is divisible by each of the polynomials $g_i(x)$;

2/ It has an operation of receiving signals representing:
K+M1+M2 sequences $\underline{a}_i$ of n symbols $\underline{a}_{ij}$;
which implements M1 permutation operations, at least one of which is not identity, each permutation being, in a representation where the binary data items of each sequence are written, row by row, into a table with N0 columns and M rows, the result of any number of so-called elementary permutations, each of which:

either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the representative table, or is any permutation of the symbols of a column of the said table;

3/ it has an operation of serial turbodecoding of K sequences of symbols using the divider polynomials $g_{ij}(x)$.

According to a sixth aspect, the present invention relates to a decoding device, characterised in that:

1/ it has a processing means adapted to take into account:
predetermined integers M1 and M2 equal to or greater than 1, a number K, greater than or equal to 1, of sequences $a_i$ (i=1, . . . ,K) of data representing a physical quantity, each sequence $a_i$ having:

a polynomial representation $a_i(x)$ which is a multiple of a predetermined polynomial $g_i(x)$, and a number of binary data items equal to the product of any integer number M and the integer N0, the smallest integer such that the polynomial $x^{N0}+1$ is divisible by each of the polynomials $g_i(x)$;

2/ it has a receiving means adapted to receive signals representing:

K+M1+M2 sequences $\underline{a}_i$ of n symbols $\underline{a}_{ij}$;
which implements M1 permutation operations, at least one of which is not identity, each permutation being, in a representation where the binary data items of each sequence are written, row by row, into a table with N0 columns and M rows, the result of any number of so-called "elementary" permutations, each of which:

either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the representative table, or is any permutation of the symbols of a column of the said table;

3/ the processing means is adapted to perform an operation of serial turbodecoding of K sequences of symbols using the divider polynomials $g_{ij}(x)$.

The invention also relates to:

an information storage means readable by a computer or a microprocessor storing instructions of a computer program, characterised in that it allows the implementation of the method of the invention as briefly described above, and an information storage means which is removable, partially or totally, and readable by a computer or a microprocessor storing instructions of a computer program, characterised in that it allows the implementation of the method of the invention as briefly described above.

The invention also relates to:

a device for processing signals representing speech, which has a device as briefly described above, a data transmission device having a transmitter adapted to implement a packet transmission protocol, which has a device as briefly described above, a data transmission device having a transmitter adapted to implement the ATM (Asynchronous Transfer Mode) packet transmission protocol, which has a device as briefly described above, a data transmission device having a transmitter adapted to implement the packet transmission protocol, on an ETHERNET (registered trade mark) type network, a network station, which has a device as briefly described above, a data transmission device having a transmitter transmitting on a wireless channel, which has a device as briefly described above, and a device for processing sequences of signals representing at most one thousand binary data items, which has a device as briefly described above.

These encoding and decoding devices, these encoding and decoding methods and these signal processing, data transmission and sequence processing devices and this network having the same particular characteristics and the same advantages as the encoding method as briefly described above, these particular characteristics and these advantages are not repeated here.

Figure 2:
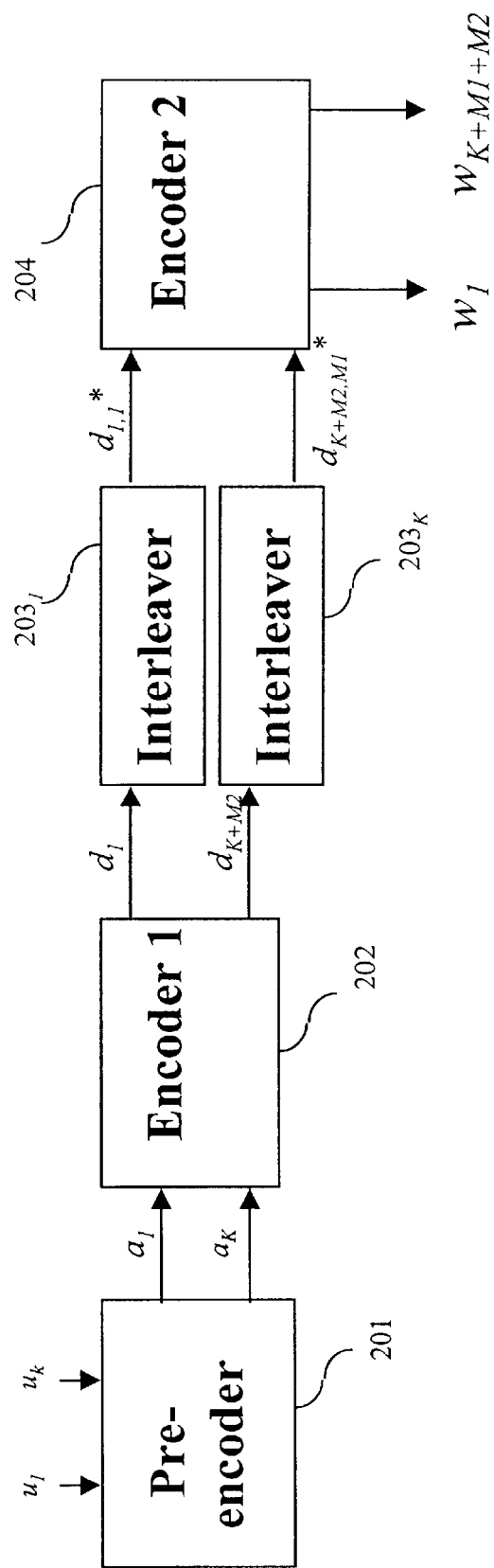
Figure 3:
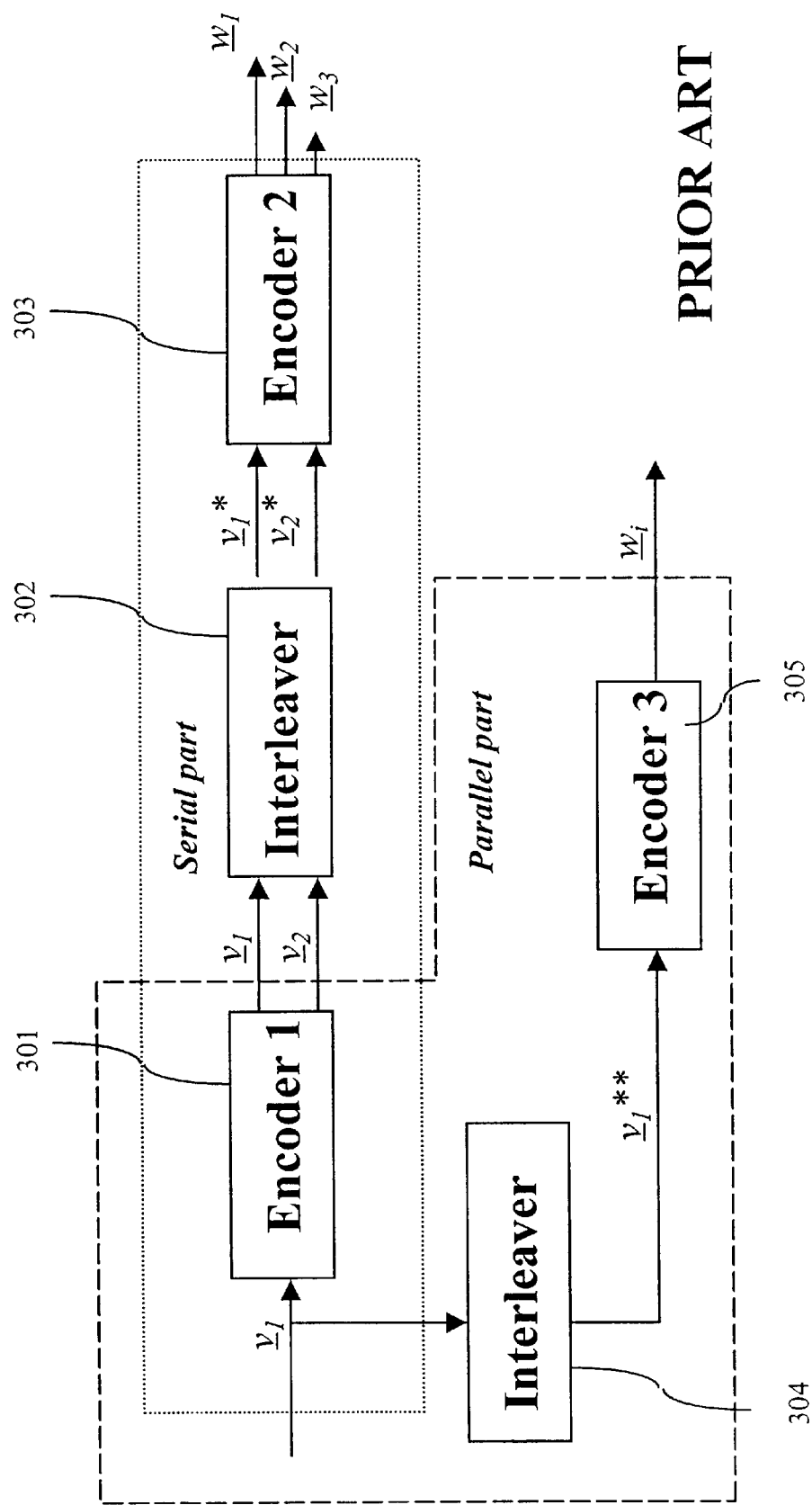
Figure 4:
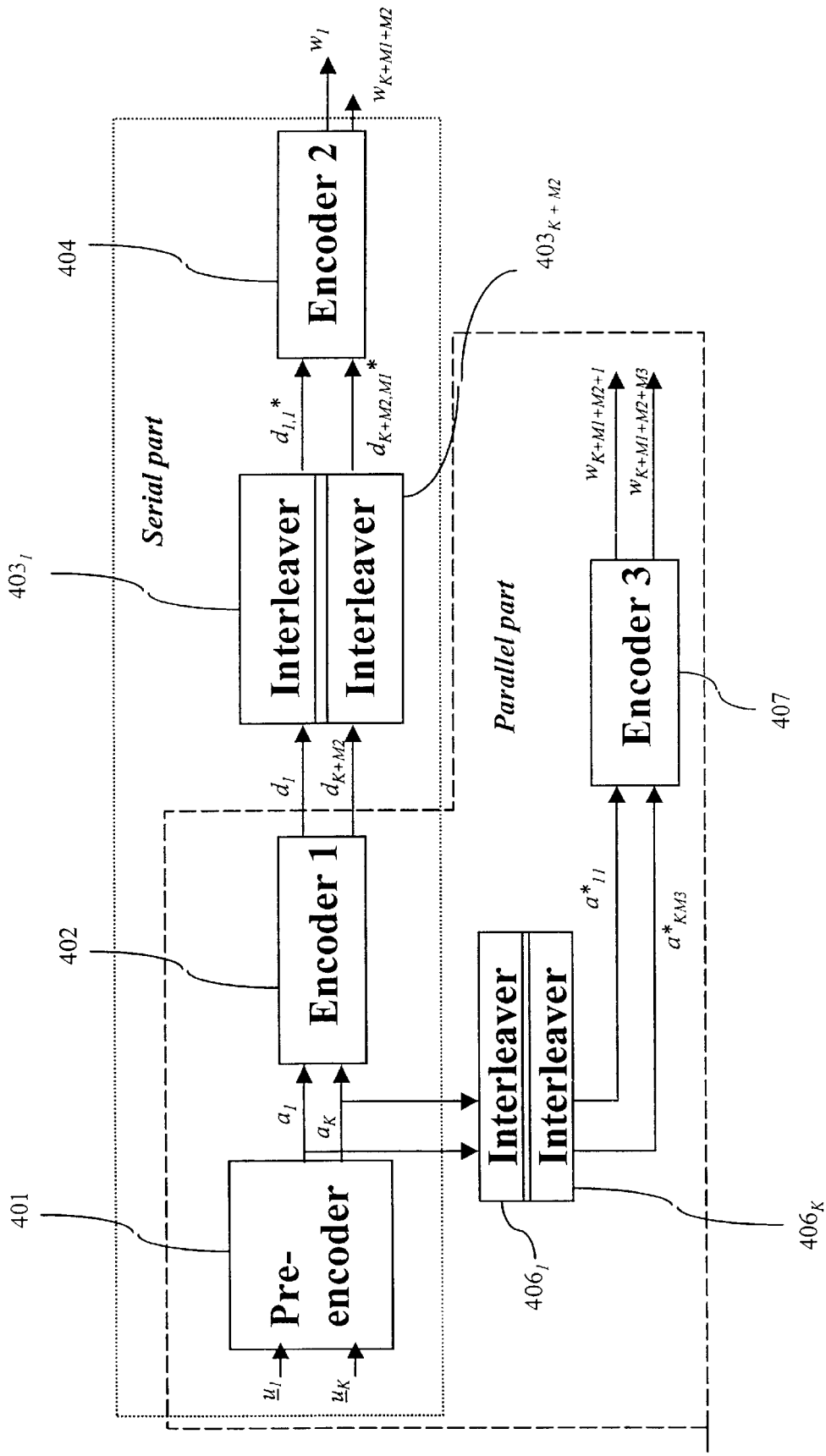
Figure 5:
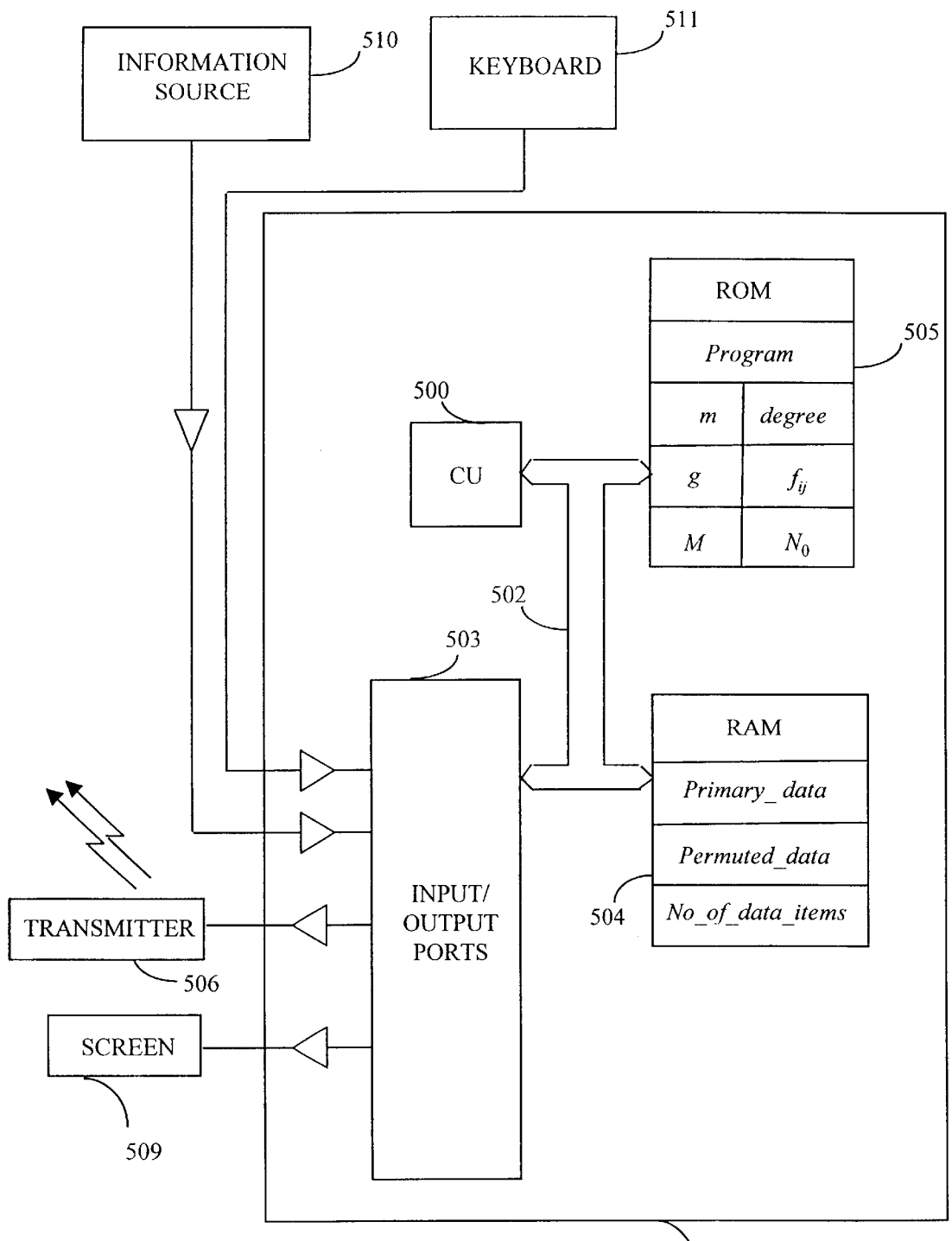
Figure 6:
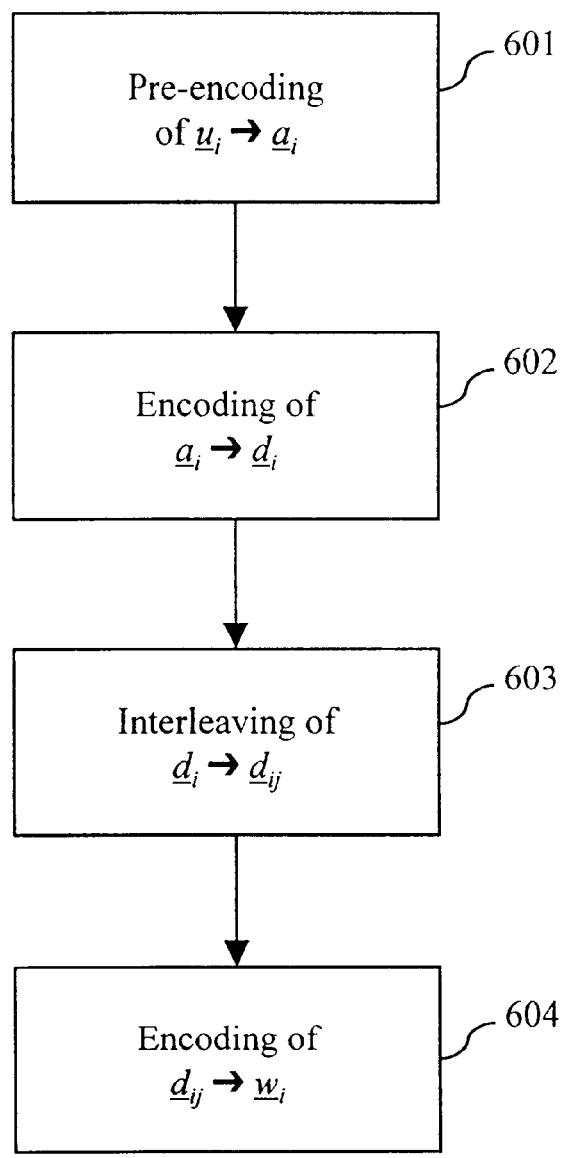
Figure 7:
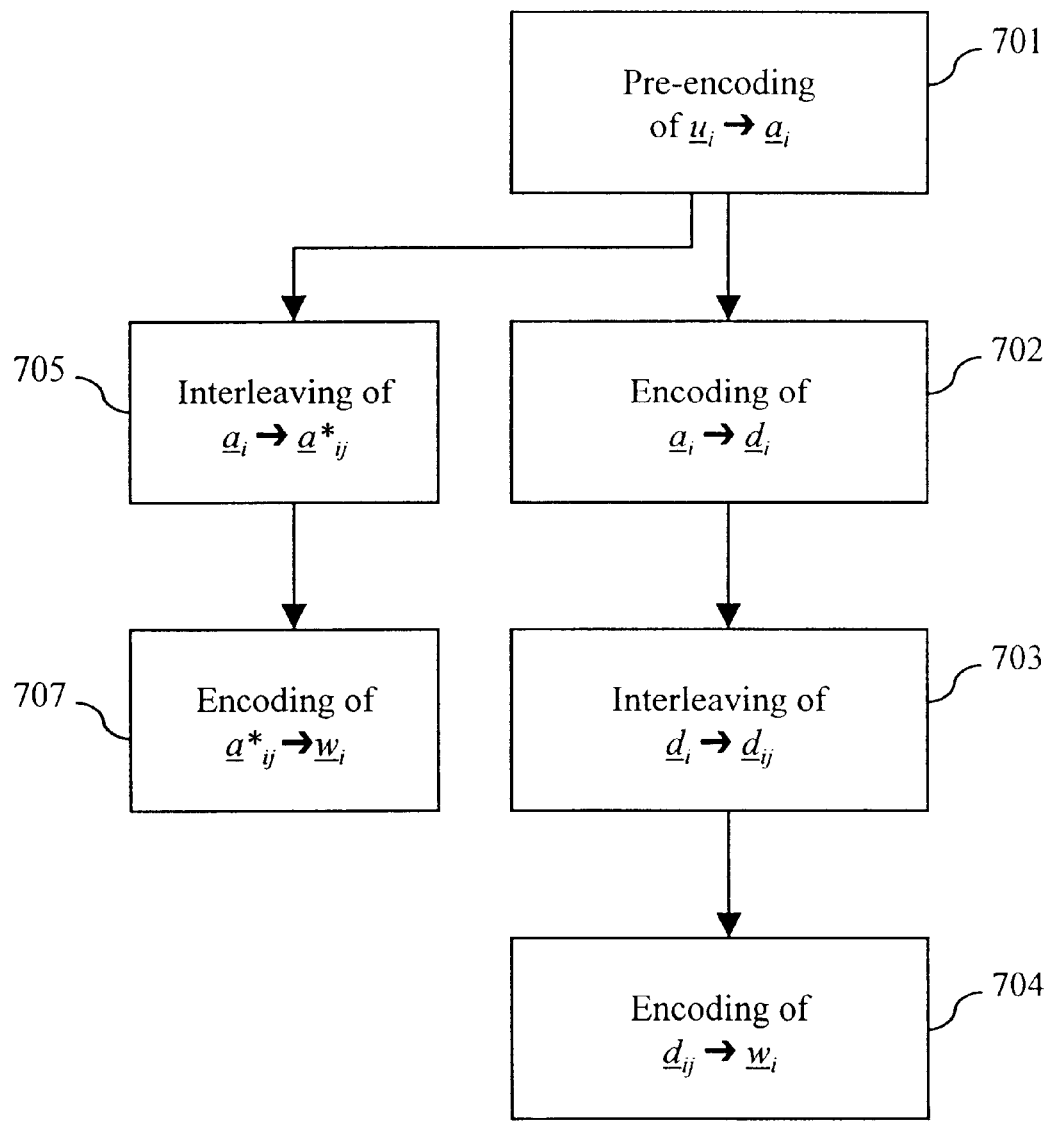
Figure 8:
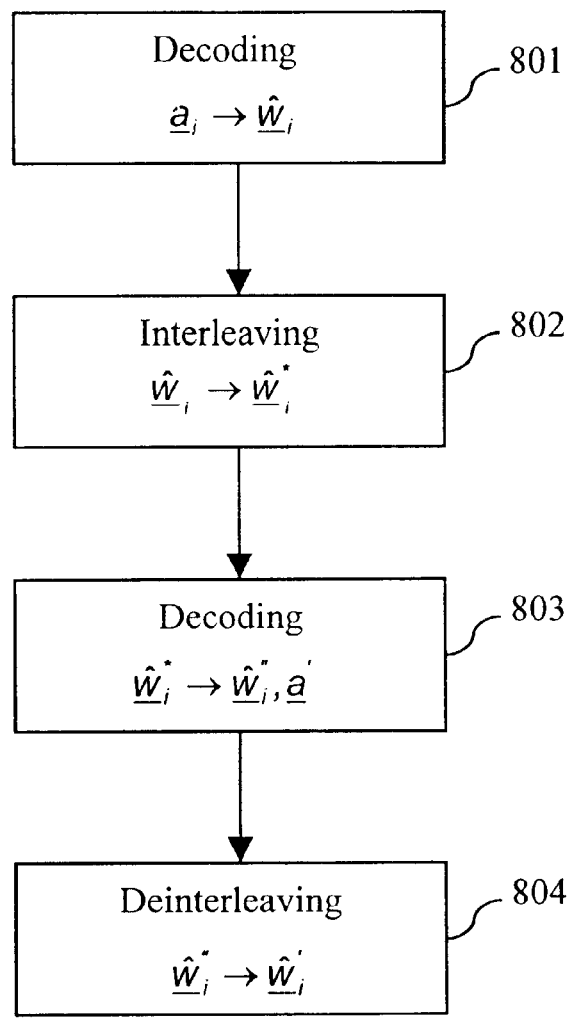
Figure 9:
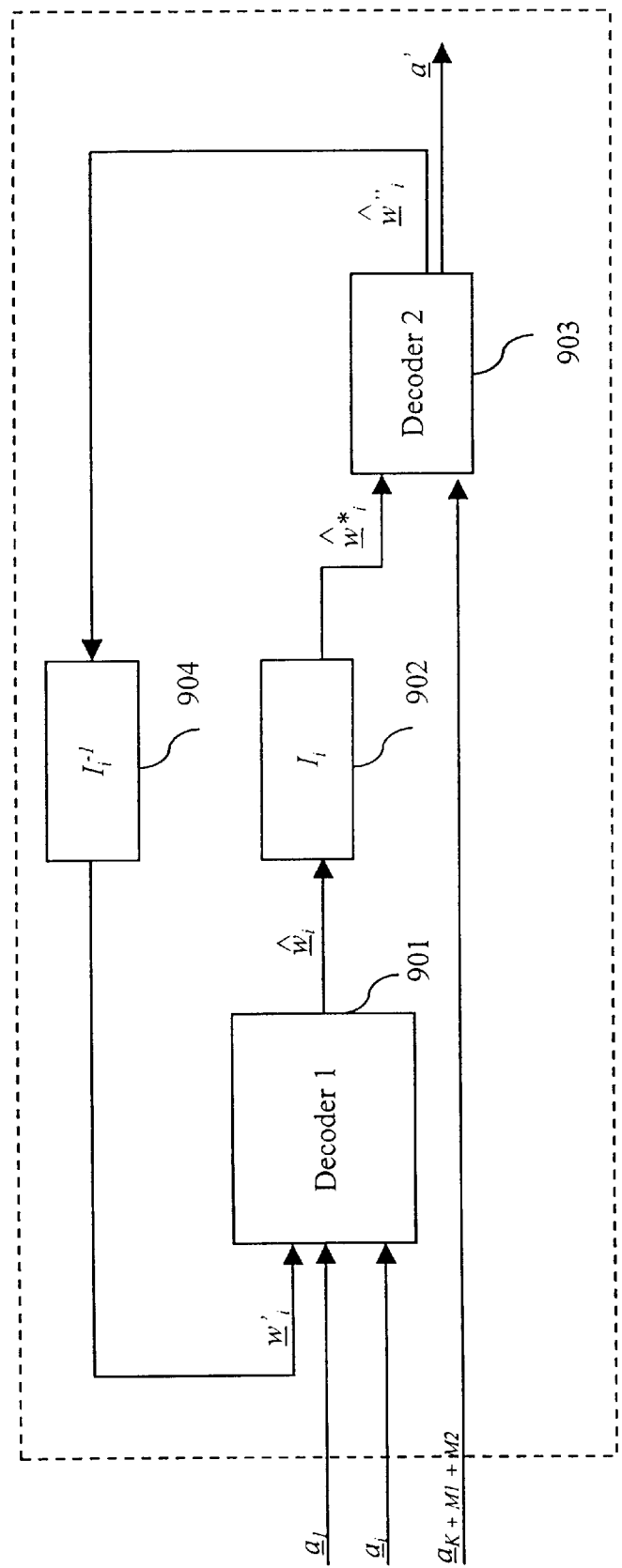

Other advantages, aims and characteristics of the present invention will emerge from the description which follows, produced with reference to the accompanying drawings in which:

FIG. 1 depicts, in functional block diagram form, a serial turbo-encoder of the prior art, FIG. 2 depicts, in functional block diagram form, a serial turbo-encoder to which the present invention relates, FIG. 3 depicts, in functional block diagram form, a hybrid turbo-encoder of the prior art, FIG. 4 depicts, in functional block diagram form, a hybrid turbo-encoder to which the present invention relates, FIG. 5 depicts, schematically, an electronic device implementing the method of the present invention, FIG. 6 is a flowchart representing schematically an encoding method implemented by a serial turbo-encoder according to FIG. 2, FIG. 7 is a flowchart representing schematically an encoding method implemented by a hybrid turbo-encoder according to FIG. 4, FIG. 8 is a flowchart representing schematically a decoding method according to the present invention, and FIG. 9 depicts, in functional block diagram form, a decoding device according to the present invention.

Before describing the content of FIGS. 1 to 9, the theoretical foundations at the root of the present invention are given here. First of all, a description is given of an encoding system characterised by polynomials $f$, $g$, $f_1$, $g_1$, $f_2$ and $g_2$ as well as by a number of parameters introduced below.

The aim is to specify a serial or hybrid turbo-encoding method. The information is represented by a sequence $(a_0, \ldots, a_{n-1})$ of binary symbols itself represented in the polynomial form: $a(x)=\Sigma a_i x^i$ The encoder first produces a sequence:

$$b(x)=a(x)f(x)/g(x)$$

and next a sequence $$c(x)=a^*(x)f_1(x)/g_1(x)+b^*(x)f_2(x)/g_2(x)$$

where the asterisk indicates that its argument has been interleaved. For example $a^*(x)$ is given by $$\sum_{i=0}^{n-1} a_i x^{\pi(i)}$$

where $\pi$ permutation acting on the integers $0, 1, \ldots, n-1$.

If it is desired that the divisions are carried out with no remainder, the conditions to be satisfied are:

a is divisible by g
a* is divisible by $g_1$
b* is divisible by $g_2$

Let a first example be considered corresponding to the choice $$g=g_1g_2=1+x+x^3, f_1=1+x+x^2+x^3, f_2=1+x^2+x^3.$$

The parameter n specifying the number of bits contains in $a(x)$ is chosen equal to an odd multiple of 7 (for example equal to 147). This number 7 is the smallest value of $N_0$ such that $g(x)$ divides $x^{N_0}-1$.

For these parameter values, the information to be transmitted is represented by a series of polynomials $$u(x) = \sum_{i=0}^{n-7} u_i x^i$$

with binary coefficients and such a $u(x)$ is precoded into a polynomial $$a(x) = u(x) + \sum_{i=n-6}^{n-1} a_i x^i$$

where the last 6 coefficients $a_i$ are chosen so that $a(x)$ is divisible by $(g(x))^2=1+x^2+x^6$.

The interleaved version $a^*(x)$ of $a(x)$ is defined by $a^*(x)=a(x^{e_1})$ modulo $(x^n-1)$ where $e_1$ is a power of 2 which guarantees that $a^*(x)$ remains divisible by $g(x)$. Moreover, since $a(x)$ is divisible by $(g(x))^2$, $b(x)=a(x)f_1(x)/g(x)$ remains divisible by $g(x)$ and, if $e_2$ is also chosen as being a power of 2, $b^*(x)=b(x^{e_2})$ modulo $(x^n-1)$ is also divisible by $g(x)$.

In this case the divisions producing $b(x)$ and $c(x)$ are carried out with no remainder. In turbo-encoding terms, the encoding of $u(x)$ into the triplet $[a(x)b(x)c(x)]$ is referred to as a serial turbo-encoding and the choice of interleavers of the type $x \to x^e$, where e is a power of 2, guarantees that, after $u(x)$ has passed through the corresponding turbo-encoder, the final state of the latter is null if its initial state is also null.

Let a second example be considered, identical to the first with the exception of the polynomial $g_1(x)$ which is now equal to $1+x^2+x^3$ (It is then equal to $f_2$ but this equality is unimportant).

The pre-encoding of $$u(x) = \sum_{i=0}^{n-7} u_i x^i$$

into the polynomial $a(x)$ of degree $n-1$ is now carried out in order to guarantee that $a(x)$ is divisible by $g_1(x) g_2(x)=1+x+x^2+x^3+x^4+x^5+x^6$.

The calculation of $b(x)=a(x)f_1(x)/g_1(x)$ is therefore performed with no remainder.

The interleaved version $a^*(x)$ of $a(x)$ can then be of the type $a^*(x)=a(x^{e_1})$ modulo $x^n-1$ or of the type $a^*(x)=a(x^{3e_1})$ modulo $x^n-1$ where $e_1$ is a power of 2.

The first type of interleaver retains the divisibility of $a(x)$ by any irreducible polynomial which is a factor of $x^7-1$: if $a(x)$ is divisible by $g_1(x)$, $a(x^{e_1})$ is also and if $a(x)$ is divisible by $g_2(x)$, $a(x^{e_1})$ is also. The second type of interleaver permutes the divisibilities by $g_1(x)$ and $g_2(x)$: if $a(x)$ is divisible by $g_1(x)$, $a(x^{3e_1})$ is divisible by $g_2(x)$ and vice versa.

In both cases, $a^*(x)$ will be divisible by $g_1(x)$ since $a(x)$ is divisible both by $g_1(x)$ and by $g_2(x)$. The calculation of the first component $a^*(x)f_1(x)/g_1(x)$ is therefore performed with no remainder.

It should be noted next that $b(x)=a(x)f(x)/g(x)$ is a multiple of $g_1(x)$. The interleaving $b^*(x)=b(x^{3e_2})$ modulo $(x^n-1)$, where $e_2$ is a power of 2, produces an interleaved polynomial $b^*(x)$ which is now a multiple of $g_2(x)$. The calculation of the component $b^*(x)f_2(x)/g_2(x)$ of $c(x)$ is therefore performed with no remainder.

In this second example, the encoding of $u(x)$ into the triplet $[a(x)b(x)c(x)]$ is a serial turbo-encoding meeting, as in the first example, the condition that the final state of the encoder is null upon its initial state being null.

Let a third example now be considered for which $g=g_1=1+x+x^3$, $f=f_1=g_2=1+x^2+x^3$, $f_2=1+x+x^2+x^3$ are taken. With choice of polynomials, the information can be represented by a polynomial $$u(x) = \sum_{i=0}^{n-4} u_i x^i$$

and this information precoded into $$a(x) = u(x) + \sum_{i=n-3}^{n-1} a_i x^i$$

so as to make $a(x)$ a multiple of $g(x)$.

The calculation of $b(x)$ is performed with no remainder. The calculation of $a^*(x)$ is performed by $a^*(x)=a(x^{e_1})$ modulo $x^n-1$, where $e_1$ is a power of 2. This choice of $e_1$ guarantees that the calculation of the contribution $a^*f_1/g_1$ to $c(x)$ is performed with no remainder. Moreover $b(x)$, in view of the choice $f=g_2$, is a multiple of $g_2$. The calculation of $b^*(x)$ is perform d by $b^*(x)=b(x^{e_2})$ modulo $x^n-1$, where $e_2$ is a power of 2, which guarantee that $b^*(x)$ remains divisible by $g_2=f$ so that the calculation of the contribution $b^*f_2/g_2$ to $c(x)$ is performed with no remainder.

In this third example, the encoding of $u(x)$ into the triple $[a(x)b(x)c(x)]$ is a serial turbo-encoding meeting the condition that the final state of the encoder is null upon its initial state being null.

It is important to accurately define the general class of interleavers making it possible to specify serial turbo-encoders for which the division operations on the sequences are carried out with no remainder.

Here are a few answers. If $a(x)$ is divisible by $g(x)$, the interleavings $a | \to a^*$ such that $a^*(x)$ is also divisible by g are as follows.

Let $N_0$ be the smallest integer such that $g(x)$ divides $x^{N_0}-1$, let $n=M N_0$ be any multiple of $N_0$ and let $a(x)$ be a polynomial of degree $n-1$ divisible by g; the coefficients $a_i$ of $a(x)$ are written into a table with M rows and $N_0$ columns, from left to right and from top to bottom. In each column, absolutely any permutation is performed. Next there is performed a permutation of the columns of the table which is in the automorphism group of the binary cyclic code of length $N_0$ and with generator polynomial $g(x)$. $a^*(x)$ is then refined as the sequence obtained by reading the table with M rows and N columns row by row from left to right and from top to bottom, as it is at the end of the said permutations.

This a*(x) will be divisible by g(x) upon a(x) being so arid only the permutations equivalent to those described have this property.

It may now be asked what the permutations are transforming any a(x) which is a multiple of $g_1(x)$ into an a*(x) which is a multiple of $g_2(x)$.

It should be noted first that this is possible only if $g_1$ and $g_2$ are equivalent in a precise sense, which is now going to be explained. For this, let $N_1$ be defined as being the smallest integer such that $g_1(x)$ is a divisor of $x^{N_1}-1$, and $N_2$ as being the smallest integer such that $g_2(x)$ is a divisor of $x^{N_2}-1$.

It follows that $g_1(x)$ can be seen as the generator polynomial of a binary cyclic code of length $N_1$ and that $g_2(x)$ can be seen as the generator polynomial of a binary cyclic code of length $N_2$. In the current context it is said that $g_1(x)$ and $g_2(x)$ are equivalent if $N_1=N_2$ and if furthermore there exists a permutation $\pi$ of the $N_1=N_2$ columns of $C_1$ which transforms any word of $C_1$ into a word of $C_2$.

Under this necessary condition, an answer can now be given to the question: what are the permutations transforming any a(x) which is a multiple of $g_1(x)$ into an a*(x) which is a multiple of $g_2(x)$?

Let $N_0$ be the common value of $N_1$ and $N_2$, let n=M $N_0$ be any multiple of $N_0$ and let a(x) be a polynomial of degree n−1 divisible by $g_1(x)$. The coefficients $a_i$ of a(x) are written into a table with M rows and $N_0$ columns, from left to right and from top to bottom. In each column, absolutely any permutation is performed. Next there is performed a permutation of the columns of the table which is in the automorphism group of the code $C_1$. Finally a permutation $\pi$ referred to above is applied to the said columns of the table. a*(x) is then defined as the sequence obtained by reading the table with M rows and N columns row by row from left to right and from top to bottom, as it is at the end of the said permutations. This a*(x) will be divisible by $g_2(x)$ and only the permutations equivalent to those described have this property.

Before describing FIGS. 1 to 9, it should be noted that a detailed description of hybrid or serial turbocodes will be found in the following documents:

the article: "*Serial concatenation of interleaved codes: Performance analysis, design and iterative decoding*", Benedetto Montorsi, (Univ. Politecnico di Torino, Italy), Divsalar, Pollara, (JPL, USA), TDA progress report, 42-126, August 1996; and the article: "*Hybrid concatenated codes and iterative decoding*", Divsalar, Pollara, (JPL, USA), TDA progress report, 42-130, August 1997.

Serial turbocodes relate to the serial concatenation of two convolutional encoders separated by an interleaver. The decoding method is iterative. Hybrid turbocodes have an architecture which is both serial and parallel. In the case of a serial turbocode, the second encodes is always systematic and recursive.

It is considered here that the first encoder is also systematic and recursive. However, the teaching of the present invention remains the same with a first encoder which is non-recursive and/or non-systematic.

In FIG. 1, it should be noted that a known serial encoder of the art prior to the present invention is essentially composed of:

an input of symbols to be coded 101, where a source, not depicted, provides one sequence $\underline{v}_i$ of binary symbols to be transmitted, or "to be coded", a first encoder 102, which provides, from the sequence $\underline{v}_i$, two sequences $\underline{v}'_i$ of symbols representing the sequence $\underline{v}_i$, an interleaver 103, which provides, from the two sequences $\underline{v}'_i$, two interleaved sequences $\underline{v}^*_i$, the symbols of which are the symbols of the sequences $\underline{v}'_i$, but in different orders, and a second encoder 104, which provides, from the two interleaved sequences $\underline{v}^*_i$, three so-called "coded" sequences $\underline{w}_i$ representing the sequence $\underline{v}_i$.

The coded sequences $\underline{W}_i$ are encapsulated in radio frames and transmitted on a wireless transmission channel in order to be next decoded.

In FIG. 2, it should be noted that, in accordance with the present invention, a serial turbo-encoder is composed of a pre-encoder 201, which receives K sequences of symbols to be transmitted $\underline{u}_i$ and adds, to each of them, so-called "padding" symbols which guarantee that the polynomial representation of each resulting sequence $\underline{a}_i$ is divisible by a divider polynomial $g_i(x)$;

a first convolutional encoder 202, which provides, from the K sequences $\underline{a}_i$, K+M2 so-called "intermediate" sequences $\underline{d}_i$, representing the sequences $\underline{a}_i$, K interleavers $203_1$ to $203_{K+M2}$, each interleaver providing, from the K+M2 sequences $d_i$, (K+M2)*M1 so-called "permuted" interleaved sequences $\underline{d}_{ij}$, the symbols of which are the symbols of the sequences $\underline{d}_i$, but in different orders, and a second convolutional encoder 204, which provides, from the (K+M2)*M1 interleaved sequences $\underline{d}_{ij}$, K+M1+M2 so-called "coded" sequences $\underline{w}_i$ representing the K sequences $\underline{a}_i$.

The coded sequences $\underline{W}_i$ are encapsulated in radio frames and transmitted on a wireless transmission channel in order to be next decoded.

In accordance with the present invention, each sequence $\underline{U}_i$ has a number of binary data items n equal to the product of any integer number M and the integer N0, the smallest integer such that the polynomial xN0+1 is divisible by each of the polynomials gi(x), from which the degree of the polynomial gi(x) is subtracted:

$$n = MN0 - (\deg(g_i(x)));$$

each sequence $\underline{a}_i$ thus has:

a polynomial representation $a_i(x)$ which is a multiple of the predetermined polynomial $g_i(x)$, and a number of binary data items equal to the product of any integer number M and the integer N0, the smallest integer such that the polynomial $x^{N0}+1$ is divisible by each of the polynomials $g_i(x)$;

3/ in the interleaver $203_i$, each sequence $d_{ij}^*$ (with i=1, . . . ,K+M2; j=1, . . . ,M1)

is obtained by a permutation of the corresponding sequence $d_i$, the said permutation being, in a representation where the binary data items of each sequence $d_i$ are written, row by row, into a table with N0 columns and M rows, the result of any number of so-called elementary permutations, each of which:

either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $d_i$, or is any permutation of the symbols of a column of the said table; and has, in consequence, a polynomial representation $d_{ij}^*$(x) which is equal to a polynomial product $c_{ij}(x)g_{ij}(x)$, at least one permuted sequence $d_{ij}*$ is different from the corresponding sequence $d_i$, 4/ the second encoder produces M1 redundant sequences, the polynomial representation of which is equal to $\Sigma f_{ij}(x)c_{ij}(x)$, for i=1, . . . , K+M2 and j=1, . . . ,M1, each polynomial $f_{ij}(x)$ being a polynomial of degree almost equal to the degree of the polynomial $g_{ij}(x)$ with the same indices i and j.

In a preferred embodiment, each polynomial $g_i(x)$ has no multiple polynomial factors, the integer number M is odd;

3/ in the interleaver $203_i$, each sequence $d_{ij}*$ has a polynomial representation equal to $d_{ij}*(x)=d_i(x^{eij})$ modulo $(x^n+1)$, where n is the product of the number M and the integer N0, $e_{ij}$ is a number relatively prime with n $c_{ij}$ is the quotient of $d_{ij}*(x)$ divided by $g_{ij}(x)$, the polynomial $g_{ij}(x)$ is the generator polynomial of the smallest cyclic code of length N0 containing the polynomial $g_i(x^{eij})$ modulo $(x^{N0}+1)$, at least one permuted sequence $a_{ij}*$ being different from the corresponding sequence $a_i$.

The type of interleaver used in the preferred embodiment is referred to as "x to $x^e$".

In a preferred embodiment, the first encoder 202 is a systematic encoder, that is to say a number K of intermediate sequences $d_i$ are each identical to one of the K sequences entering the encoder 202.

It should be noted here that the examples given as illustrations of the theoretical fundamentals at the root of the present invention correspond to a serial turbo-encoder as illustrated in FIG. 2.

Thus, for constituent encoders and given interleavers, the pre-encoder is designed in such a way that the first and second constituent encoders return to the null final state.

For decoding the signals transmitted by the serial turbo-encoder illustrated in FIG. 2, it should be noted here that use is made of a turbodecoder using interleavers and de-interleavers having the same characteristics as the interleavers of the turbo-encoder illustrated in FIG. 3.

In accordance with the present invention, the decoders are initialized taking into account the fact that the encoders 102 and 104 each have a null initial state and final state.

In FIG. 6, it should be noted that, in accordance with the present invention, a serial turbo-encoding method comprises following steps:

a pre-encoding step 601, which consists of receiving K sequences of symbols to be transmitted $u_i$ and adding, to each of them, so-called "padding" symbols which guarantee that the polynomial representation of each resulting sequence $a_i$ is divisible by a divider polynomial $g_i(x)$;

a first convolutional encoding step 602, which consists of providing, from the K sequences $a_i$, K+M2 so-called "intermediate" sequences $d_i$, representing the sequences $a_i$, an interleaving step 603, consisting of interleaving the sequences $d_i$ by means of K interleavers $203_1$ to $203_{K+M2}$, each interleaver providing, from the K+M2 sequences $d_i$, (K+M2)*M1 so-called "permuted" interleaved sequences $d_{ij}$, the symbols of which are the symbols of the sequences $d_i$, but in different orders, and a second convolutional encoding step 604, which consists of providing, from the (K+M2)*M1 interleaved sequences $d_{ij}$, K+M1+M2 so-called "coded" sequences $w_i$ representing the K sequences $a_i$.

The coded sequences $w_i$ are encapsulated in radio frames and transmitted on a wireless transmission channel in order to be next decoded.

FIG. 3 shows a hybrid turbo-encoder in accordance with the prior art, composed of a first convolutional encoder 301, which provides, from a sequence $v_1$, two so-called "intermediate" sequences $v_1$ and $v_2$ representing the sequence $v_1$, an interleaver 302 providing two sequences $v_1*$ and $v_2*$, the symbols of which are the symbols of the sequences $v_1$ and $v_2$, but in different orders, a second convolutional encoder 303, which provides, from the two interleaved sequences $v_1*$, three so-called "coded" sequences $w_i$ representing the sequence $v_1$, an interleaver 304 providing, from the sequence $v_1$, a so-called "permuted" interleaved sequence $v_1$, the symbols of which are the symbols of the sequence $v_1$, but in different orders, and a third convolutional encoder 305, which provides, from the interleaved sequence $v_1$, a so-called "coded" sequence $w_i$ representing the sequence $v_1$.

The four coded sequences $w_i$ are encapsulated in ratio frames and transmitted on a wireless transmission channel in order to be next decoded.

In FIG. 4, it should be noted that, in accordance with the present invention, a hybrid turbo-encoder is composed of a pre-encoder 401, which receives K sequences of symbols to be transmitted $u_i$ and adds, to each of them, so-called "padding" symbols which guarantee that the polynomial representation of each resulting sequence $a_i$ is divisible by a divider polynomial $g_i(x)$;

a first convolutional encoder 402, which provides, from the K sequences $a_i$, K+M2 so-called "intermediate" sequences $d_i$, representing the sequences $a_i$, interleavers $403_1$ to $403_{K+M2}$, the interleaver $403_i$ providing, from the K+M2 sequences $d_i$, (K+M2)*M1 so-called "permuted" interleaved sequences $d_{ij}$, the symbols of which are the symbols of the sequence $d_i$, but in different orders, a second convolutional encoder 404, which provides, from the (K+M2).M1 interleaved sequences $d_{ij}$, K+M1+M2 so-called "encoded" sequences $w_i$ representing the K sequences $a_i$, interleavers $406_1$ to $406_K$, the interleaver $406_i$ providing, from the K sequences $a_i$, (K)*M3 so-called "permuted" interleaved sequences $a*_{ij}$, the symbols of which are the symbols of the sequences $a_i$, but in different orders, and a third convolutional encoder 407, which provides, from the K*M3 interleaved sequences $a_{ij}$, K+M3 so-called "encoded" sequences $w_i$ representing the K sequences $a_i$.

The K+M1+M2+M3 coded sequences $w_i$ are encapsulated in radio frames and transmitted on a wireless transmission channel in order to be next decoded.

In accordance with the present invention, all the interleavers have the characteristics described with reference to FIG. 2 and, preferably, the characteristics of the preferred embodiment (concerning "x to $x^e$" type interleavers) described with reference to FIG. 2.

In a preferred embodiment, the third encoder 407 is a systematic encoder.

For decoding the signals transmitted by the hybrid turbo-encoder illustrated with reference to FIG. 4, it should be noted here that use is made of a turbodecoder using interleavers and de-interleavers having the same characteristics as the interleavers of the turbo-encoder illustrated in FIG. 2.

In accordance with the present invention, the decoders are initialized taking into account the fact that the encoders 502, 504 and 507 each have a null initial state and final state.

In FIG. 7, it should be noted that, in accordance with the present invention, a hybrid turbo-encoding method comprises following steps:

- a pre-encoding step 701, which consists of receiving K sequences of symbols to be transmitted $\underline{u}_i$ and adding, to each of them, so-called "padding" symbols which guarantee that the polynomial representation of each resulting sequence $\underline{a}_i$ is divisible by a divider polynomial $g_i(x)$;
- a first convolutional encoding step 702, which consists of providing, from the K sequences $\underline{a}_i$, K+M2 so-called "intermediate" sequences $\underline{d}_i$, representing the sequences $\underline{a}_i$,
- an interleaving step 703, consisting of interleaving the sequences $\underline{d}_i$ by means of interleavers $403_1$ to $403_{K+M2}$, the interleaver $403_i$ providing, from the K+M2 sequences $\underline{d}_i$, (K+M2)*M1 so-called "permuted" interleaved sequences $\underline{d}_{ij}$, the symbols of which are the symbols of the sequences $\underline{d}_i$, but in different orders,
- a second convolutional encoding step 704, which consists of providing, from the (K+M2).M1 interleaved sequences $\underline{d}_{ij}$, K+M1+M2 so-called "encoded" sequences $\underline{w}_i$ representing the K sequences $\underline{a}_i$,
- another interleaving step 705, consisting of interleaving the sequences $\underline{a}_i$ by means of interleavers $406_1$ to $406_K$, the interleaver $406_i$ providing, from the K sequences $\underline{a}_i$, (K)*M3 so-called "permuted" interleaved sequences $\underline{a}^*_{ij}$, the symbols of which are the symbols of the sequences $\underline{a}_i$, but in different orders, and
- a third convolutional encoding step 707, which consists of providing, from the K*M3 interleaved sequences $\underline{a}^*_{ij}$, K+M3 so-called "encoded" sequences $\underline{w}_i$ representing the K sequences $\underline{a}_i$.

The K+M1+M2+M3 coded sequences $\underline{w}_i$ are encapsulated in radio frames and transmitted on a wireless transmission channel in order to be next decoded.

FIG. 5 illustrates schematically the composition of a network station or computer encoding station, in block diagram form. This station has a keyboard 511, a screen 509, an external information source 510 and a radio transmitter 506, jointly connected to an input/output port 503 of a processing card 501.

The processing card 501 has, interconnected by an address and data bus 502:

- a central processing unit 500;
- a random access memory RAM 504;
- a read-only memory ROM 505;
- the input/output port 503;

Each of the elements illustrated in FIG. 5 is well known to persons skilled in the art of microcomputers and transmission systems and, more generally, information processing systems. These common elements are therefore not described here. It should be noted, however, that:

- the information source 510 is, for example, an interface peripheral, a sensor, a demodulator, an external memory or another information processing system (not depicted), and is preferably adapted to provide sequences of signals representing speech, service messages or multimedia data, in the form of sequences of binary data,
- the radio transmitter 506 is adapted to implement a packet transmission protocol on a wireless channel, and to transmit these packets on such a channel.

It should be noted, moreover, that the word "register" used in the description designates, in each of the memories 504 and 505, both a memory area of small capacity (a few binary data items) and a memory area of large capacity (allowing storage of a complete program).

The random access memory 504 stores data, variables and intermediate processing results, in memory registers having, in the description, the same names as the data whose values they store. The random access memory 504 has notably:

- a register "primary_data" in which are stored, in the order of their arrival on the bus 502, the binary data coming from the information source 510, in the form of sequences $\underline{u}_i$, next added to in order to form the sequences $\underline{a}_i$,
- a register "no_of_data_items" which stores an integer number corresponding to the number of binary data items in each sequence in the register "binary_data", and
- a register "permuted_data" which stores the permuted sequences, as described with reference to FIG. 2 or 4.

The read-only memory 505 is adapted to store, in registers which, for convenience, have the same names as the data they store:

- the operating program for the central processing unit 500, in a register "program",
- each sequence $g_i$, and each sequence $g_{ij}$, in a register "g",
- the degree m of each polynomial representation, $g_i(x)$ of a sequence $g_i$, in a register "degree",
- each sequence $f_{ij}$, in a register "$f_{ij}$",
- the value of N0, in a register "N0",
- the value of M, in a register "M", and
- the table defining each interleaver, in a register "interleaver".

The central processing unit 500 is adapted to implement the encoding functions described in FIGS. 2, 4 and 5 and the decoding functions which correspond to them.

As a variant, the operating program of the central processing unit 500 may be stored in a removable storage means, such as a floppy risk, a CD-ROM, a DVD, a memory card, or any other removable storage means.

For the encoding, as for the decoding, preferably, all the values of the exponents $e_{ij}$ having the same value of the index j are identical.

Preferably also, all the values of the exponents $e_{ij}$ are equal to a power of 2.

According to a variant, not depicted, the encoding and transmission device performs the transmission on the one hand of the sequences $\underline{a}_i$, and, on the other hand, of a subset of the data of the other sequences. This technique is known to persons skilled in the art by the name "puncturing".

As regards the decoding, persons skilled in the a of turbo-encodings who are familiar with a turbo-encoder know how to make the corresponding turbodecoder.

In FIG. 8, it can be seen that a decoding method adapted to decode the sequences sent by the encoding method illustrated in FIG. 6 has, essentially:

- a decoding step 801 corresponding to the encoding step 602, which consists of receiving the estimations of transmitted sequences $\underline{a}_i$ as well as a plurality of extrinsic information sequences $\underline{w}'_i$, and supplying a plurality of estimation sequences a posteriori $\underline{\hat{w}}_i$,
- an interleaving step 802, using a plurality of interleavers 902, identical to the interleavers $203_1$ to $203_K$ used in the encoding device, consisting of receiving respectively the sequences $\underline{\hat{w}}_i$ and interleaving them respectively as $\underline{\hat{w}}''_i$, a second decoding step 803, corresponding to the encoding step 604, consisting of receiving the sequences $\underline{\hat{w}}''_i$ as well as the sequence $\underline{a}_{K+M1+M2}$ and supplying on the one hand, a plurality of a posteriori estimation sequences $\underline{\hat{w}}''_i$ and, on the other hand, an estimated sequence $\underline{a}'$, and a deinterleaving step 804, using a plurality of deinterleavers 904, the reverse of the interleavers $203_1$ to $203_K$, receiving the sequences $\underline{\hat{w}}''_i$ and supplying the sequences $\underline{\hat{w}}'_i$.

The estimated sequence $\underline{a}'$ is taken into account only following a predetermined number of iterations (see the article "Near Shannon, limit error-correcting coding and decoding: turbocodes" cited in the introduction).

In accordance with the present invention, the decoding method takes into account:

the predetermined integers M1 and M2 (and M3 where applicable) equal to or greater than 1, the number K, greater than or equal to 1, of sequences $a_i$ (i=1, . . . ,K) of data representing a physical quantity, each sequence $a_i$ having:

a polynomial representation $a_i(x)$ which is a multiple of a predetermined polynomial $g_i(x)$, and a number of binary data items equal to the product of any integer number M and the integer N0, the smallest integer such that the polynomial $x_{N0}+1$ is divisible by each of the polynomials $g_i(x)$.

This decoding method has an operation of receiving signals representing:

K+M1+M2 sequences $\underline{a}_i$ of n symbols $\underline{a}_{ij}$;

and implements permutation operations, at least one of which is not identity, each permutation being, in a representation where the binary data items of each sequence are written, row by row, into a table with N0 columns and M rows, the result of any number of so-called elementary permutations, each of which:

either has the property of transforming the cyclic code of length N0 and with generator polynomial $g_i(x)$ into an equivalent cyclic code with generator polynomial $g_i(x)$ which may be equal to $g_i(x)$, and acts by permutation on the N0 columns of the representative table, or is any permutation of the symbols of a column of the said table.

In FIG. 9, it can be seen that a decoding device adapted to decode the sequences sent by the encoding device illustrated in FIG. 2 has, essentially:

a decoder 901 corresponding to the encoders 202, which receives the estimations of transmitted sequences $\underline{a}_i$ as well as a plurality of extrinsic information sequences $\underline{w}'_i$, and supplies a plurality of estimation sequences a posterior $\underline{\hat{w}}_i$, a plurality of interleavers 902, identical to the interleavers $203_1$ to $203_K$ used in the encoding device, which receive respectively the sequences $\underline{\hat{w}}_i$ and interleave them respectively as $\underline{\hat{w}}'_i$, a second decoder 903, corresponding to the encoder 204, receiving the sequences $\underline{\hat{w}}''_i$ as well as the sequence $\underline{a}_{K+M1+M2}$ and supplies, on the one hand, a plurality of a posteriori estimation sequences $\underline{\hat{w}}'_i$ and, on the other hand, an estimated sequence $\underline{a}'$, and a plurality of deinterleavers 904, the reverse of the interleavers $203_1$ to $203_K$, receiving the sequences $\underline{\hat{w}}'_i$ and supplying the sequences $\underline{\hat{w}}'_i$.

The estimated sequence $\underline{a}'$ is taken into account only following a predetermined number of iterations (see the article "Near Shannon limit error-correcting coding and decoding: turbocodes" cited in the introduction).

In accordance with the present invention, the interleavers and deinterleavers used for decoding each have the same characteristics as the interleavers used for encoding and preferably, are of the type "x to $x^e$". Preferably, for encoding as for decoding, for an identical value of j, the exponents $e_{ij}$ are equal. Also preferably, for encoding as for decoding, the values of the exponents $e_{ij}$ are all powers of 2.

Concerning decoding, the reader can refer:

to the article by L. R. BAHL, J. COCKE, F. JELINEK and J. RAVIV entitled "*Optimal decoding of linear codes for minimizing symbol error rate*", published in the journal IEEE Transactions on Information Theory, in March 1974;

to the article by J. HAGENAUER, E. OFFER and L. PAPKE entitled "*Iterative decoding of binary block and convolutional codes*", published in the journal IEEE Transactions on Information Theory, in March 1996;

to the article by J. HAGENAUER and P. HOEHER entitled "*A Viterbi algorithm with soft decision output and its applications*", published with the reports of the conference IEEE GLOBECOM, pages 1680–1686, in November 1989;

to the article by J. HAGENAUER, P. ROBERTSON and L. PAPKE entitled "*Iterative (turbo) decoding of systematic convolutional codes with the MAP and SOVA algorithms*", published by the journal Informationstechnische Gesellschaft (ITG) Fachbericht, pages 21–29, October 1994; and to the article by C. BERROU, S. EVANO and G. BATTAIL, entitled "*Turbo-block-codes*", published with the reports of the seminar "Turbo Coding" organised by the Institute of Technology of Lünd (Sweden) (Department of Applied Electronics) in August 1996.

What is claimed is:

1. Encoding method, characterised in that:

1/ it takes into account:

two predetermined integers M1 and M2, equal to or greater than 1, a number K, greater than or equal to 1, of sequences $a_i$ (i=1, . . . ,K) of binary data representing a physical quantity, each sequence $a_i$ having:

a polynomial representation $a_i(x)$ which is a multiple of a predetermined polynomial $g_i(x)$, and a number of binary data items equal to the product of any integer number M and the integer N0, the smallest integer such that the polynomial $x^{N0}+1$ is divisible by each of the polynomials $g_i(x)$;

2/ it has an operation of convolutional encoding of the sequences $a_i$ into K+M2 intermediate sequences $d_i$, 3/ it has a first production operation for a number (K+M2) *M1 of permuted sequences, $d_{ij}$*, (i=1, . . . ,K+M2; j=1, . . . ,M1), each sequence $d_{ij}$* being obtained by a permutation of the corresponding sequence $d_i$, the said permutation being, in a representation where the binary data items of each sequence $d_i$ are written, row by row, into a table with N0 columns and M rows, the result of any number of elementary permutations, each of which:

either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $d_i$, or is any permutation of the symbols of a column of the said table; and having, in consequence, a polynomial representation $d_{ij}^*(x)$ which is equal to a polynomial product $c_{ij}(x) g_{ij}(x)$, at least one permuted sequence $a_{ij}^*$ being different from the corresponding sequence $a_i$;

4/ it has a second production operation for M1 redundant sequences, the polynomial representation of which is equal to $\Sigma f_{ij}(x) c_{ij}(x)$, for $i=1, \ldots, K+M2$ and $j=1, \ldots, M1$, each polynomial $f_{ij}(x)$ being a polynomial of degree at most equal to the degree of the polynomial $g_{ij}(x)$ with the same indices i and j.

2. Encoding method, characterised in that:

1/ it takes into account:

two predetermined integers M1 and M2, equal to or greater than 1, a number K, greater than or equal to 1, of sequences $a_i$ ($i=1, \ldots, K$) of binary data representing a physical quantity, each sequence $a_i$ having:

a polynomial representation $a_i(x)$ which is a multiple of a predetermined polynomial $g_i(x)$ with no multiple polynomial factors, and a number of binary data items equal to the product of any odd integer number M and the integer N0, the smallest integer such that the polynomial $x^{N0}+1$ is divisible by each of the polynomials $g_i(x)$;

2/ it has an operation of convolutional encoding of the sequences $a_i$ into K+M2 intermediate sequences $d_i$, 3/ it has a first production operation for a number (K+M2)*M1 of permuted sequences, $d_{ij}^*$, ($i=1, \ldots, K$; $j=1, \ldots, M1$), each sequence $d_{ij}^*$ having a polynomial representation equal to $d_{ij}^*(x)=d_i(x^{e_{ij}})$ modulo $(x^n+1)$, where n is the product of the number M and the integer N0, $e_{ij}$ is a number relatively prime with n $c_{ij}$ is the quotient of $d_{ij}^*(x)$ divided by $g_{ij}(x)$, the polynomial $g_{ij}(x)$ is the generator polynomial of the smallest cyclic code of length N0 containing the polynomial $g_i(x^{e_{ij}})$ modulo $(x^{N0}+1)$, at least one permuted sequence $a_{ij}^*$ being different from the corresponding sequence $a_i$;

4/ it has a second production operation for M1 redundant sequences, the polynomial representation of which is equal to $\Sigma f_{ij}(x) c_{ij}(x)$, for $i=1, \ldots, K+M2$ and $j=1, \ldots, M1$, each polynomial $f_{ij}(x)$ being a predetermined polynomial of degree at most equal to the degree of the polynomial $g_{ij}(x)$ with the same indices i and j.

3. Encoding method according to claim 2, characterised in that, during the first production operation, all the values of the exponents $e_{ij}$ having the same value of the index j are identical.

4. Encoding method according to either one of claims 2 or 3, characterised in that, during the first production operation, all the values of the exponents $e_{ij}$ are equal to a power of 2.

5. Encoding method according to any one of claims 1 to 3, characterised in that it has an operation of transmitting, on the one hand, the sequences $\underline{a}_i$, and, on the other hand, a subset of the data of the other sequences.

6. Encoding method according to any one of claims 1 to 3, characterised in that it has an addition operation during which additional padding information items are added to sequences $\underline{u}_i$ of information data items in order to form the sequences $\underline{a}_i$ guaranteeing the divisibility of the polynomial representation of the resulting sequence $\underline{a}_i$ by the polynomial $g_i(x)$.

7. Encoding method according to any one of claims 1 to 3, characterised in that, during the operation of convolutional encoding of the sequences $a_i$ into K+M2 intermediate sequences $d_i$, an operation of multiplying the polynomial representation of each sequence $\underline{a}_i$ by the polynomial $g_i(x)$ is performed.

8. Encoding method according to any one of claims 1 to 3, characterised in that, furthermore:

5/ it has a third production operation for a number K*M3 of permuted sequences, $a'_{ij}$, ($i=1, \ldots, K$; $j=1, \ldots, M3$), each sequence $a'_{ij}^*$ being obtained by a permutation of the corresponding sequence $a_i$, the said permutation being, in a representation where the binary data items of each sequence $a_i$ are written, row by row, into a table with N0 columns and M rows, the result of any number of elementary permutations, each of which:

either has the property of transforming the cyclic code of length N0 and with generator polynomial $g'_i(x)$ into an equivalent cyclic code with generator polynomial $g'_{ij}(x)$ which may be equal to $g'_i(x)$, and acts by permutation on the N0 columns of the table representing $a_i$, or is any permutation of the symbols of a column of the said table; and having, in consequence, a polynomial representation $a'_{ij}^*(x)$ which is equal to a polynomial product $b'_{ij}(x) g'_{ij}(x)$, 6/ it has a fourth production operation for M3 redundant sequences, the polynomial representation of which is equal to $\Sigma f'_{ij}(x) b'_{ij}(x)$, for $j=1, \ldots, M3$, each polynomial $f'_{ij}(x)$ being a polynomial of degree at most equal to the degree of the polynomial $g'_{ij}(x)$ with the same indices i and j.

9. Encoding method according to any one of claims 1 to 3, characterised in that:

5/ it has a third production operation for a number K*M3 of permuted sequences, $a'_{ij}^*$, ($i=1, \ldots, K$; $j=1, \ldots, M3$), each sequence $a'_{ij}^*$ having a polynomial representation equal to $a'_{ij}^*(x)=a_i(x^{e'_{ij}})$ modulo $(x^n+1)$, where n is the product of the number M and the integer N0, $e'_{ij}$ is a number relatively prime with n $b'_{ij}$ is the quotient of $a'_{ij}^*(x)$ divided by $g'_{ij}(x)$, the polynomial $g'_{ij}(x)$ is the generator polynomial of the smallest cyclic code of length N0 containing the polynomial $g'_i(x^{e'_{ij}})$ modulo $(x^{N0}+1)$, 6/ it has a fourth production operation for M3 redundant sequences, the polynomial representation of which is equal to $\Sigma f'_{ij}(x) b'_{ij}(x)$, for $j=1, \ldots, M3$, each polynomial $f'_{ij}(x)$ being a predetermined polynomial of degree at most equal to the degree of the polynomial $g'_{ij}(x)$ with the same indices i and j.

10. Decoding method, characterised in that:

1/ it takes into account:

predetermined integers M1 and M2 equal to or greats than 1, a number K, greater than or equal to 1, of sequences $a_i$ ($i=1, \ldots, K$) of data representing a physical quantity, each sequence $a_i$ having:

a polynomial representation $a_i(x)$ which is a multiple of a predetermined polynomial $g_i(x)$, and a number of binary data items equal to the product of any integer number M and the integer N0, the smallest integer such that the polynomial $x^{N0}+1$ is divisible by each of the polynomials $g_i(x)$;

2/ it has an operation of receiving signals representing:

K+M1+M2 sequences $\underline{a}_i$ of n symbols $\underline{a}_{ij}$;

which implements M1 permutation operations, at least one of which is not identity, each permutation being, in a representation where the binary data items of each sequence are written, row by row, into a table with N0 columns and M rows, the result of any number of elementary permutations, each of which:
   either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the representative table,
   or is any permutation of the symbols of a column of the said table;

3/ it has an operation of serial turbodecoding of K sequences of symbols using the divider polynomials $g_{ij}(x)$.

11. Decoding method according to claim 10, characterised in that each said permutation is defined by a number $e_{ij}$ relatively prime with the number n defined as the product of an odd integer M and the integer N0, in such a way that if $q(x)$ is the polynomial representation of the sequence before permutation, then $q(x^{e_{ij}})$ modulo $(x^n+1)$ is the polynomial representation of the sequence after permutation.

12. Decoding method according to claim 11, characterised in that, during the first production operation, all the values of the exponents $e_{ij}$ having the same value of the index j are identical.

13. Decoding method according to either one of claims 11 or 12, characterised in that, during the first production operation, all the values of the exponents $e_{ij}$ are equal to a power of 2.

14. Encoding device, characterised in that it has a processing means adapted to:
1/ take into account:
   two predetermined integers M1 and M2, equal to or greater than 1,
   a number K, greater than or equal to 1, of sequences $a_i$ (i=1, . . . ,K) of binary data representing a physical quantity, each sequence $a_i$ having:
      a polynomial representation $a_i(x)$ which is a multiple of a predetermined polynomial $g_i(x)$, and
      a number of binary data items equal to the product of any integer number M and the integer N0, the smallest integer such that the polynomial $x^{N0}+1$ is divisible by each of the polynomials $g_i(x)$;
2/ perform a convolutional encoding of the sequences $a_i$ into K+M2 intermediate sequences $d_i$,
3/ perform a first production operation for a number (K+M2)*M1 of permuted sequences, $d_{ij}^*$, (i=1, . . . , K+M2; j=1, . . . ,M1), each sequence $d_{ij}^*$ being obtained by a permutation of the corresponding sequence $d_i$, the said permutation being, in a representation where the binary data items of each sequence $d_i$ are written, row by row, into a table with N0 columns and M rows, the result of any number of elementary permutations, each of which:
   either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $d_i$,
   or is any permutation of the symbols of a column of the said table; and
   having, in consequence, a polynomial representation $d_{ij}^*(x)$ which is equal to a polynomial product $c_{ij}(x) g_{ij}(x)$,
   at least one permuted sequence $a_{ij}^*$ being different from the corresponding sequence $a_i$;
4/ perform a second production operation for M1 redundant sequences, the polynomial representation of which is equal to $\Sigma f_{ij}(x) c_{ij}(x)$, for i=1, . . . , K+M2 and j=1, . . . ,M1, each polynomial $f_{ij}(x)$ being a polynomial of degree at most equal to the degree of the polynomial $g_{ij}(x)$ with the same indices i and j.

15. Encoding device, characterised in that it has a processing means adapted to:
1/ take into account:
   two predetermined integers M1 and M2, equal to or greater than 1,
   a number K, greater than or equal to 1, of sequences $a_i$ (i=1, . . . ,K) of binary data representing a physical quantity, each sequence $a_i$ having:
      a polynomial representation $a_i(x)$ which is a multiple of a predetermined polynomial $g_i(x)$ with no multiple polynomial factors, and
      a number of binary data items equal to the product of any odd integer number M and the integer N0, the smallest integer such that the polynomial $x^{N0}+1$ is divisible by each of the polynomials $g_i(x)$;
2/ perform an operation of convolutional encoding of the sequences $a_i$ into K+M2 intermediate sequences $d_i$,
3/ perform a first production operation for a number (K+M2)*M1 of permuted sequences, $d_{ij}^*$, (i=1, . . . ,K; j=1, . . . ,M1), each sequence $a_{ij}^*$ having a polynomial representation equal to $d_{ij}^*(x)=d_i(x^{e_{ij}})$ modulo $(x^n+1)$, where
   n is the product of the number M and the integer N0,
   $e_{ij}$ is a number relatively prime with n
   $c_{ij}$ is the quotient of $d_{ij}^*(x)$ divided by $g_{ij}(x)$,
   the polynomial $g_{ij}(x)$ is the generator polynomial of the smallest cyclic code of length N0 containing the polynomial $g_i(x^{e_{ij}})$ modulo $(x^{N0}+1)$,
   at least one permuted sequence $a_{ij}^*$ being different from the corresponding sequence $a_i$;
4/ perform a second production operation for M1 redundant sequences, the polynomial representation of which is equal to $\Sigma f_{ij}(x) c_{ij}(x)$, for i=1, . . . ,K+M2 and j=1, . . . ,M1, each polynomial $f_{ij}(x)$ being a predetermined polynomial of degree at most equal to the degree of the polynomial $g_{ij}(x)$ with the same indices i and j.

16. Encoding device according to claim 15, characterised in that the processing means is adapted to use, during the first production operation, values of the exponents $e_{ij}$ which are identical, when they have the same value of the index j.

17. Encoding device according to either one of claims 15 or 16, characterised in that the processing means is adapted to use, during the first production operation, values of the exponents $e_{ij}$ which are all equal to a power of 2.

18. Encoding device according to any one of claims 14 to 16, characterised in that it has a transmission means adapted to transmit, on the one hand, the sequences $\underline{a}_i$, and, on the other hand, a subset of the data of the other sequences.

19. Encoding device according to any one of claims 14 to 16, characterised in that the processing means is adapted to add additional padding information items to sequences $\underline{u}_i$ of information data items in order to form the sequences $\underline{a}_i$ guaranteeing the divisibility of the polynomial representation of the resulting sequence $\underline{a}_i$ by the polynomial $g_i(x)$.

20. Encoding device according to any one of claims 14 to 16, characterised in that the processing means is adapted, for performing the convolutional encoding of the sequences $a_i$ into K+M2 intermediate sequences $d_i$, to perform an operation of multiplying the polynomial representation of each sequence $a_i$ by the polynomial $g_i(x)$.

21. Encoding device according to any one of claims 14 to 16, characterised in that the processing means is also adapted to:
  5/ perform a third production operation for a number K*M3 of permuted sequences, $a'_{ij}*$, (i=1, ... ,K; j=1, ... ,M3), each sequence $a'_{ij}*$
  being obtained by a permutation of the corresponding sequence $a_i$, the said permutation being, in a representation where the binary data items of each sequence $a_i$ are written, row by row, into a table with N0 columns and M rows, the result of any number of elementary permutations, each of which:
    either has the property of transforming the cyclic code of length N0 and with generator polynomial $g'_i(x)$ into an equivalent cyclic code with generator polynomial $g'_{ij}(x)$ which may be equal to $g'_i(x)$, and acts by permutation on the N0 columns of the table representing $a_i$,
    or is any permutation of the symbols of a column of the said table; and
  having, in consequence, a polynomial represents $a'_{ij}*(x)$ which is equal to a polynomial product $b'_{ij}(x)g'_{ij}(x)$,
  6/ perform a fourth production operation for M3 redundant sequences, the polynomial representation of which is equal to $\Sigma f'_{ij}b'_{ij}(x)$, for j=1, ... ,M3, each polynomial $f'_{ij}(x)$ being a polynomial of degree at most equal to the degree of the polynomial $g'_{ij}(x)$ with the same indices i and j.

22. Encoding device according to any one of claims 14 to 16, characterised in that the processing means is also adapted:
  5/ to perform a third production operation for a number K*M3 of permuted sequences, $a'_{ij}*$, (i=1, ... ,K; j=1, ... ,M3), each sequence $a'_{ij}*$ having a polynomial representation equal to $a'_{ij}*(x)=a_i(x^{e'ij})$ modulo $(x^n+1)$, where
    n is the product of the number M and the integer N0,
    $e'_{ij}$ is a number relatively prime with n
    $b'_{ij}$ is the quotient of $a'_{ij}*(x)$ divided by $g'_{ij}(x)$,
    the polynomial $g'_{ij}(x)$ is the generator polynomial of the smallest cyclic code of length N0 containing the polynomial $g'_i(x^{e'ij})$ modulo $(x^{N0}+1)$,
  6/ to perform a fourth production operation for M3 redundant sequences, the polynomial representation of which is equal to $\Sigma f'_{ij}(x)b'_{ij}(x)$, for j=1, ... ,M3, each polynomial $f'_{ij}(x)$ being a predetermined polynomial of degree at most equal to the degree of the polynomial $g'_{ij}(x)$ with the same indices i and j.

23. Decoding device, characterised in that:
  1/ it has a processing means adapted to take into account:
    predetermined integers M1 and M2 equal to or greater than 1,
    a number K, greater than or equal to 1, of sequences $a_i$ (i=1, ... ,K) of data representing a physical quantity, each sequence $a_i$ having:
      a polynomial representation $a_i(x)$ which is a multiple of a predetermined polynomial $g_i(x)$, and
      a number of binary data items equal to the product of any integer number M and the integer N0, the smallest integer such that the polynomial $x^{N0}+1$ is divisible by each of the polynomials $g_i(x)$;
  2/ it has a receiving means adapted to receive signals representing:
    K+M1+M2 sequences $\underline{a}_i$ of n symbols $\underline{a}_{ij}$;
    which implements M1 permutation operations, at least one of which is not identity, each permutation being, in a representation where the binary data items of each sequence are written, row by row, into a table with N0 columns and M rows, the result of any number of elementary permutations, each of which:
      either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the representative table,
      or is any permutation of the symbols of a column of the said table;
  3/ the processing means is adapted to perform an operation of serial turbodecoding of K sequences of symbols using the divider polynomials $g_{ij}(x)$.

24. Decoding device according to claim 23, characterised in that the processing means is adapted so that each said permutation is defined by a number $e_{ij}$ relatively prime with the number n defined as the product of an odd integer M and the integer N0, in such a way that if q(x) is the polynomial representation of the sequence before permutation, then $q(x^{eij})$ modulo $(x^n+1)$ is the polynomial representation of the sequence after permutation.

25. Decoding device according to claim 24, characterised in that the processing means is adapted so that, during the first production operation, all the values of the exponents $e_{ij}$ having the same value of the index j are identical.

26. Decoding device according to either one of claims 24 or 25, characterised in that the processing means is adapted so that, during the first production operation, all the values of the exponents $e_{ij}$ are equal to a power of 2.

27. Device for processing signals representing speech, characterised in that it has an encoding device according to any one of claims 14 to 16 or a decoding device according to any one of claims 23 to 25.

28. Data transmission device having a transmitter adapted to implement a packet transmission protocol, characterized in that it has an encoding device according to any one of claims 14 to 16 or a decoding device according to any one of claims 23 to 25.

29. Data transmission device according to claim 28, characterised in that the said protocol is the ATM (Asynchronous Transfer Mode) protocol.

30. Data transmission device according to claim 28, characterised in that the said protocol is the ETHERNET type protocol.

31. Data transmission device having a transmitter transmitting on a wireless channel, characterised in that it has an encoding device according to any one of claims 14 to 16 or a decoding device according to any one of claims 23 to 25.

32. Device for processing sequences of signals representing at most one thousand binary data items, characterised in that it has an encoding device according to any one of claims 14 to 16 or a decoding device according to any one of claims 23 to 25.

33. Network station, characterised in that it has an encoding device according to any one of claims 14 to 16 or a decoding device according to any one of claims 23 to 25.

34. An information storage means readable by a computer or a microprocessor storing instructions of a computer program, characterized in that it allows the implementation of the method of any one of claims 1 to 3.

35. An information storage means which is removable, partially or totally, and readable by a computer or a microprocessor storing instructions of a computer program, characterized in that it allows the implementation of the method of any one of claims 1 to 3.

* * * * *

UNITED STATES PATENT AND TRADEMARK OFFICE
CERTIFICATE OF CORRECTION

PATENT NO.    : 6,560,362 B1
DATED         : May 6, 2003
INVENTOR(S)   : Philippe Piret et al.

It is certified that error appears in the above-identified patent and that said Letters Patent is hereby corrected as shown below:

<u>Title page,</u>
Item [56], References Cited, OTHER PUBLICATIONS,
"neerSIBSN:" should read -- neers IBSN: --.

<u>Column 1,</u>
Line 5, "a encoding" should read -- an encoding --.

<u>Column 3,</u>
Line 13, "have," should read -- have --;
Line 21, "or" should read -- *of* --; and
Line 23, "1992)." should read -- 1992. --.

<u>Column 8,</u>
Line 67, "a* (x)" should read -- a*(x) --.

<u>Column 9,</u>
Line 6, "permutation" should read -- is a permutation --;
Line 15, "$g=g_1g_2$", should read -- $g=g_1=g_2$ --; and
Line 16, "contains" should read -- contained --.

<u>Column 10,</u>
Line 47, "triple" should read -- triplet --; and
Line 67, "refined" should read -- defined --.

<u>Column 11,</u>
Line 3, "arid" should read -- and --; and
Line 43, "Benedetto" should read -- Benedetto, --.

<u>Column 12,</u>
Lines 7 and 29, "sequences $\underline{W}_i$" should read -- sequences $\underline{w}_i$. --; and
Line 33, "sequences $\underline{U}_i$" should read -- sequences $\underline{u}_i$. --.

UNITED STATES PATENT AND TRADEMARK OFFICE
CERTIFICATE OF CORRECTION

PATENT NO. : 6,560,362 B1
DATED : May 6, 2003
INVENTOR(S) : Philippe Piret et al.

It is certified that error appears in the above-identified patent and that said Letters Patent is hereby corrected as shown below:

Column 16,
Line 51, "a" should read -- art --; and
Line 67, "$\underline{\hat{w}}"_i,$" should read -- $\underline{\hat{w}}_i^*$, --.

Column 17,
Line 2, "sequences $\underline{\hat{w}}"_i$" should read -- sequences $\underline{\hat{w}}^*_i$ --.
Line 13, "*Shannon,*" should read -- *Shannon* --;
Line 26, "polynomial $x_{NO+1}$" should read -- polynomial $x^{NO}+1$ --;
Line 52, "posterior" should read -- posteriori --;
Line 56, "$\underline{\hat{w}}"_i$" should read -- $\underline{\hat{w}}^*_i$ --; and
Lines 58, 60 and 64, "sequences $\underline{\hat{w}}"_i$" should read -- sequences $\underline{\hat{w}}^*_i$ --.

Column 18,
Line 12, "published in the" delete italics;
Line 13, delete italics;
Line 14, "March" delete italics;
Line 28, "published by the journal Information-" delete italics; and
Line 29, delete italics.

Column 19,
Line 35, "n" should read -- n, --.

Column 20,
Line 7, "$a'_{ij}$," should read -- $a'_{ij}{}^*$, --;
Line 39, "n" should read -- n, --; and
Line 53, "greats" should read -- greater --.

UNITED STATES PATENT AND TRADEMARK OFFICE
CERTIFICATE OF CORRECTION

PATENT NO. : 6,560,362 B1
DATED : May 6, 2003
INVENTOR(S) : Philippe Piret et al.

It is certified that error appears in the above-identified patent and that said Letters Patent is hereby corrected as shown below:

<u>Column 22,</u>
Line 32, "n" should read -- n, --.

<u>Column 23,</u>
Line 26, "$\Sigma f'_{ij} b'_{ij}(x)$," should read -- $\Sigma f'_{ij}(x) b'_{ij}(x)$, --; and
Line 39, "n" should read -- n, --.

Signed and Sealed this

Second Day of March, 2004

JON W. DUDAS
*Acting Director of the United States Patent and Trademark Office*